United States Patent
Kido

(10) Patent No.: US 9,419,105 B2
(45) Date of Patent: Aug. 16, 2016

(54) METHOD FOR PROCESSING SUBSTRATE AND METHOD FOR FABRICATING APPARATUS

(71) Applicant: Gold Charm Limited, Apia (WS)

(72) Inventor: Shusaku Kido, Kanagawa (JP)

(73) Assignee: Gold Charm Limited, Apia (WS)

(*) Notice: Subject to any disclaimer, the term of this patent is extended or adjusted under 35 U.S.C. 154(b) by 706 days.

(21) Appl. No.: 13/848,058

(22) Filed: Mar. 21, 2013

(65) Prior Publication Data

US 2014/0004667 A1  Jan. 2, 2014

Related U.S. Application Data

(62) Division of application No. 13/117,928, filed on May 27, 2011, now abandoned.

(30) Foreign Application Priority Data

May 29, 2006 (JP) .................. 2006-147810

(51) Int. Cl.
| | |
|---|---|
| H01L 29/66 | (2006.01) |
| G03F 7/20 | (2006.01) |
| G03F 7/40 | (2006.01) |
| H01L 21/027 | (2006.01) |
| H01L 21/67 | (2006.01) |
| H01L 27/12 | (2006.01) |

(52) U.S. Cl.
CPC ........ H01L 29/66765 (2013.01); G03F 7/2022 (2013.01); G03F 7/40 (2013.01); H01L 21/0273 (2013.01); H01L 21/67225 (2013.01); H01L 27/1288 (2013.01)

(58) Field of Classification Search
None
See application file for complete search history.

(56) References Cited

U.S. PATENT DOCUMENTS

| | | | | |
|---|---|---|---|---|
| 2001/0053570 A1* | 12/2001 | Kido | ......................... | G03F 7/40 438/149 |
| 2002/0000557 A1* | 1/2002 | Kido | ................... | H01L 21/0274 257/66 |
| 2002/0119586 A1* | 8/2002 | Kido | ................... | H01L 27/1214 438/30 |
| 2003/0012869 A1* | 1/2003 | Kido | ...................... | B05D 3/107 427/58 |
| 2003/0041971 A1* | 3/2003 | Kido | ................... | H01J 37/3244 156/345.33 |
| 2003/0129548 A1* | 7/2003 | Kido | ...................... | G03F 7/427 430/327 |
| 2005/0061439 A1* | 3/2005 | Kido | ...................... | C07C 239/10 156/345.1 |
| 2005/0062952 A1* | 3/2005 | Kido | ................... | H01L 21/0274 355/84 |
| 2005/0064614 A1* | 3/2005 | Kido | ................... | H01L 21/0273 438/30 |
| 2005/0087301 A1* | 4/2005 | Kido | ................... | H01L 21/0273 156/345.32 |
| 2005/0230348 A1* | 10/2005 | Kido | ................... | H01L 21/0273 216/58 |
| 2006/0093968 A1* | 5/2006 | Kido | ......................... | G03F 7/40 430/330 |
| 2006/0093969 A1* | 5/2006 | Kido | ......................... | G03F 7/40 430/330 |
| 2006/0141789 A1* | 6/2006 | Kido | ................. | H01L 21/31144 438/689 |
| 2007/0224547 A1* | 9/2007 | Kido | ......................... | G03F 7/40 430/322 |

\* cited by examiner

*Primary Examiner* — Allan Olsen
(74) *Attorney, Agent, or Firm* — ScienBiziP, P.C.

(57) ABSTRACT

A method for processing a substrate, the substrate comprising an organic film pattern, the method comprising: a fusion/deformation step of fusing said organic film pattern to deform the fused organic film pattern and a third removal step of removing at least a part of the fused and deformed organic film pattern.

14 Claims, 20 Drawing Sheets

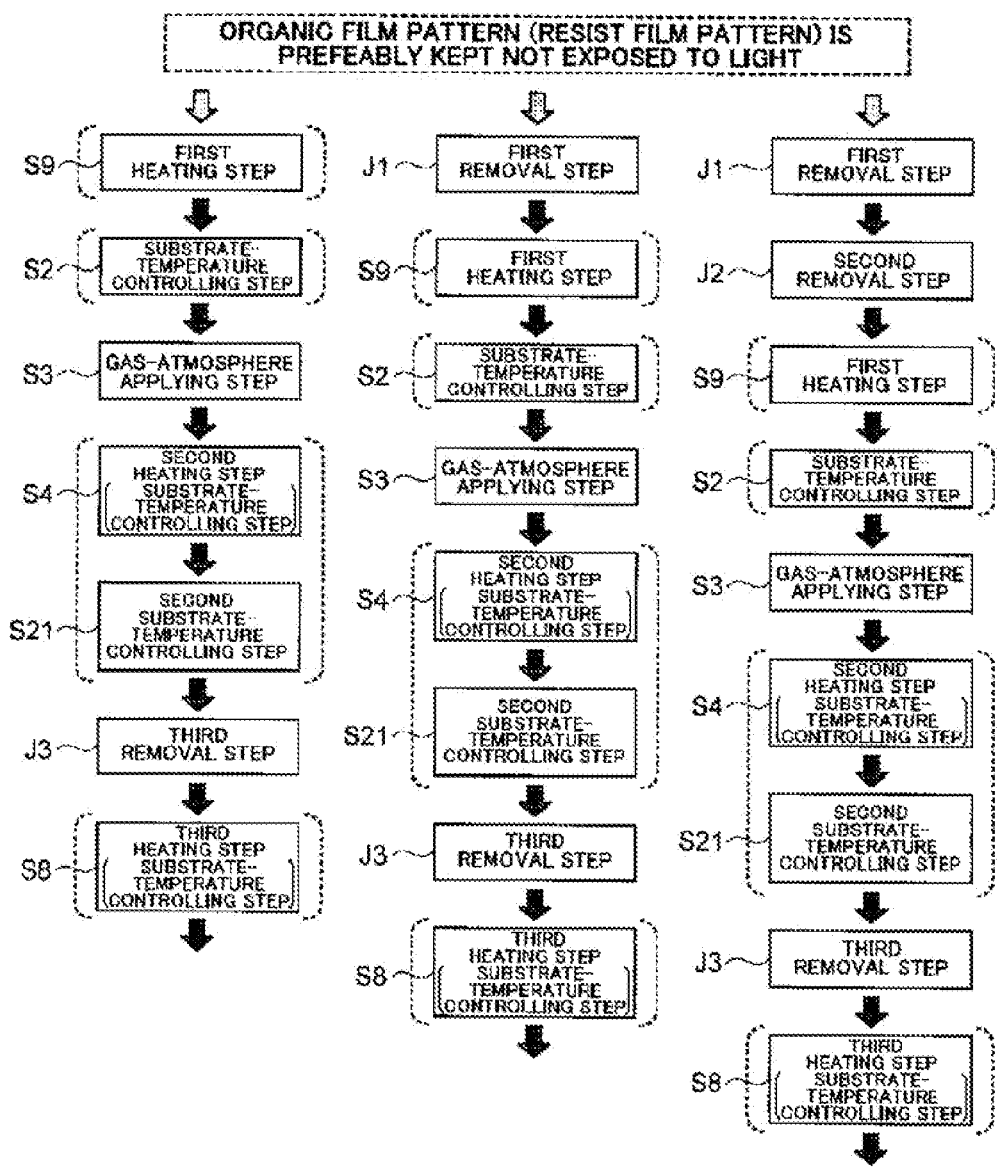

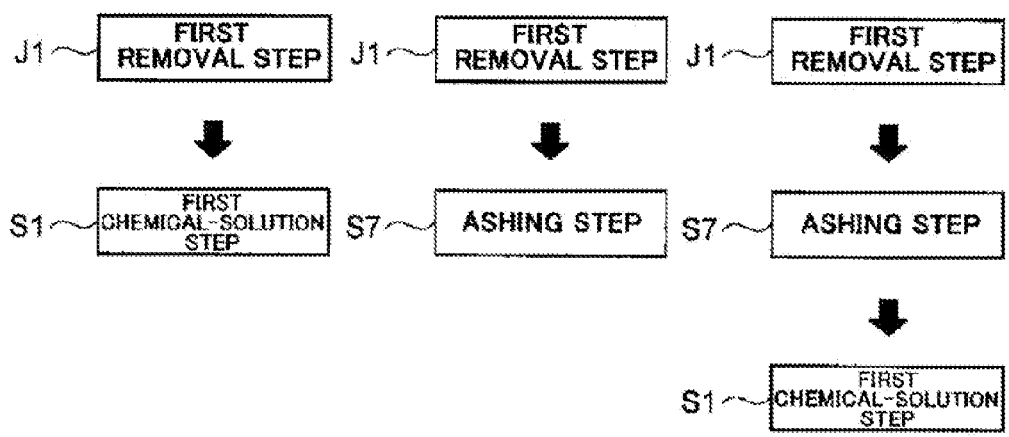

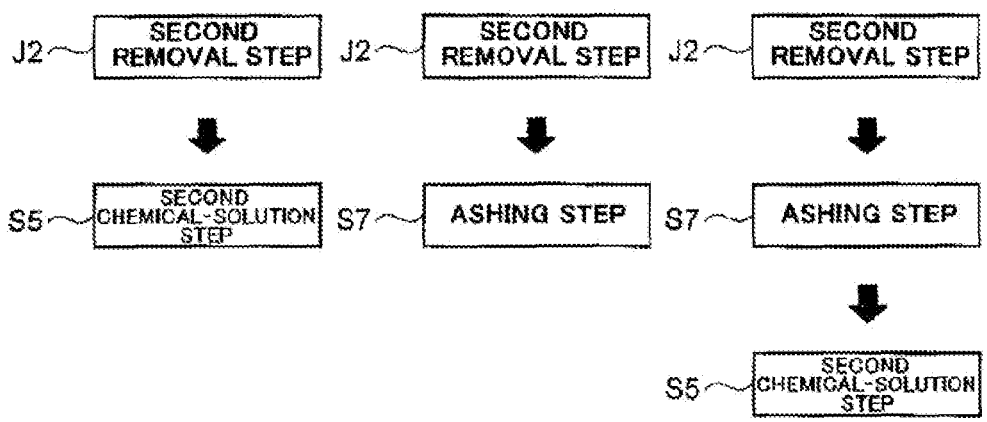

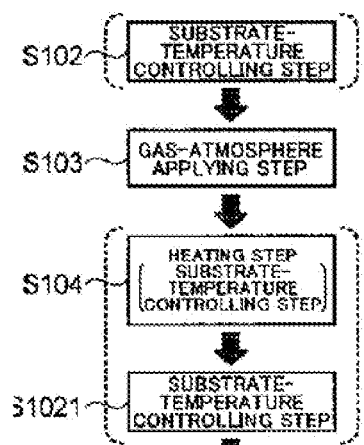
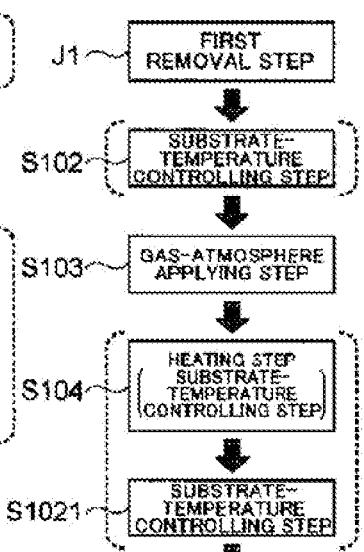
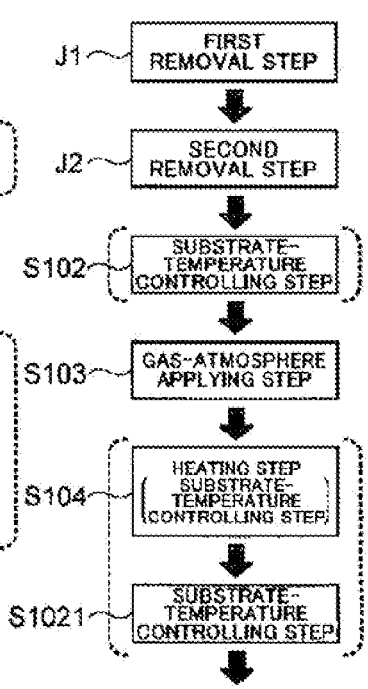
FIG.11A RELATED ART
FIG.11B RELATED ART
FIG.11C RELATED ART

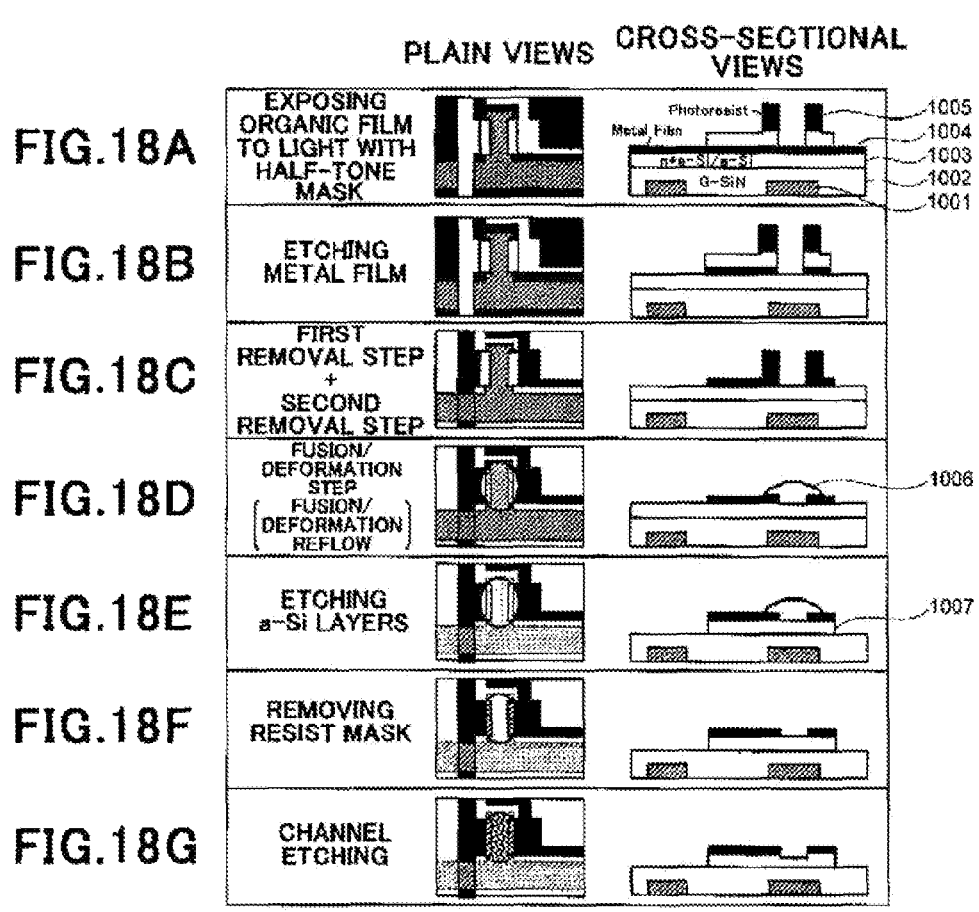

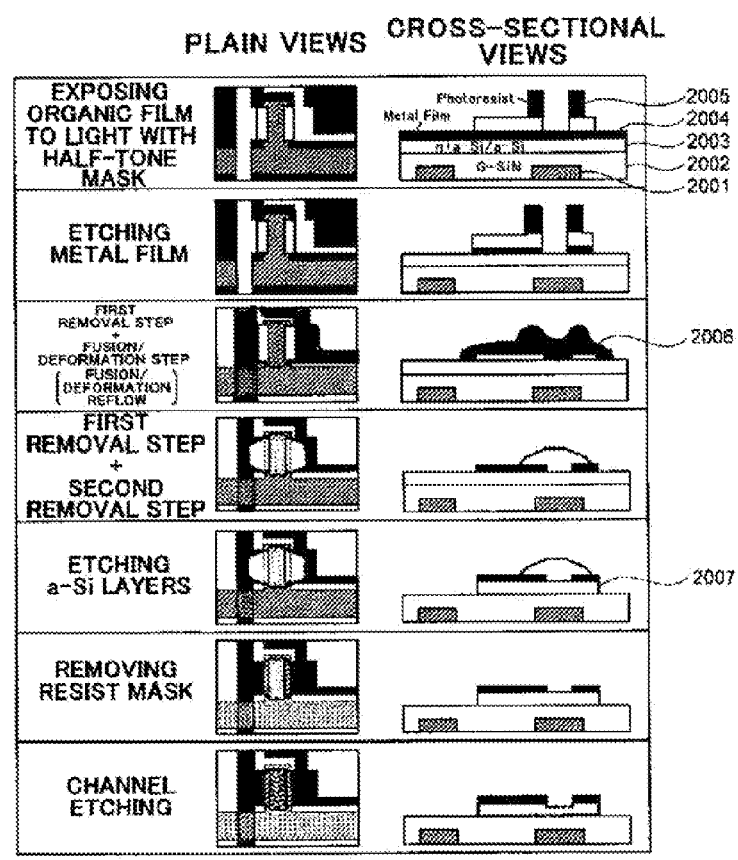

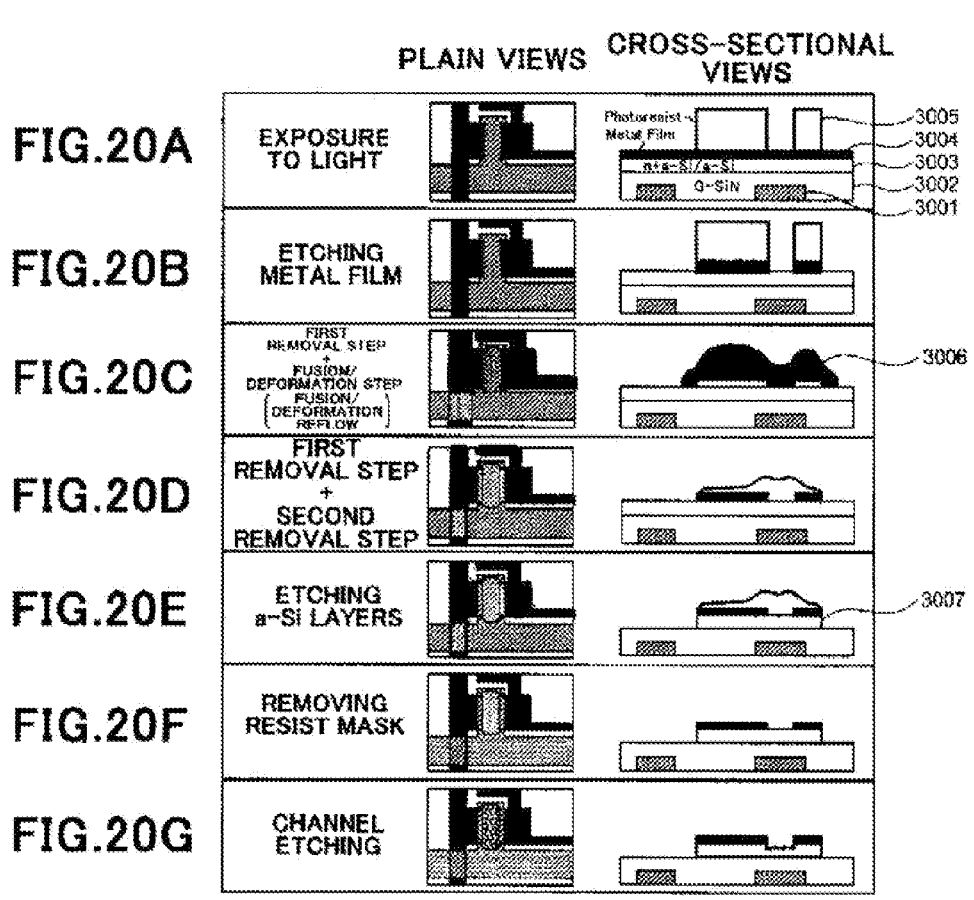

METHOD FOR PROCESSING SUBSTRATE AND METHOD FOR FABRICATING APPARATUS

CROSS REFERENCE TO THE RELATED APPLICATIONS

This application is a divisional of U.S. patent application Ser. No. 13/117,928, filed May 27, 2011, which claims priority from Japanese Patent Application No. 2006-147810, filed May 29, 2006, the contents of all of which is incorporated herein by reference in their entirety.

BACKGROUND

1. Technical Field

The present invention relates to a method for processing a substrate and a method of fabricating an apparatus including the processed substrate, and chemical solution to be used in the method.

2. Description of Related Art

A wiring in a circuit has been conventionally formed, for instance, by forming an organic film pattern on a semiconductor wafer, a liquid crystal display (LCD) substrate or other substrates, and etching a film underlying the organic film pattern, that is, the substrate with the organic film pattern being used as a mask to thereby pattern the underlying film. After the underlying film has been patterned, the organic film pattern is removed.

For instance, Japanese Patent Application Publications Nos. 2002-202619, 2002-334830, 2005-159292, 2005-159342, and 2005-159293 have suggested a method of processing an organic film pattern, including processing an underlying film, deforming an organic film pattern, etching the underlying film with the deformed organic film pattern being used as a mask, and removing the organic film pattern.

Specifically, the suggested method includes a step of deforming an organic film pattern (hereinafter, referred to as "fusion/deformation step", or referred to as "gas-atmosphere applying step" because the "fusion/deformation step" is carried out by exposing a substrate to gas atmosphere), patterning an underlying film with the deformed organic film pattern being used as a mask, and removing the organic film pattern.

Namely, the suggested method includes the fusion/deformation step (specifically, the gas-atmosphere applying step) as a principal step.

In order to stably carry out those steps, the method may include steps of controlling (specifically, lowering) a temperature of a substrate to a suitable temperature, and heating the organic film pattern to be able to readily bake the organic film pattern after the organic film pattern has been deformed. The step of heating the organic film pattern may be carried out by broadening a range of a temperature in which the step of controlling a temperature of a substrate is carried out.

FIGS. 11A, 11B and 11C show steps to be carried out in the above-mentioned related method.

As illustrated in FIG. 11A, the first related method of processing a substrate includes in sequence of a substrate-temperature controlling step S102 of controlling a temperature of a substrate, a gas-atmosphere applying step S103 of applying gas atmosphere to the substrate, a heating step S104 of heating the substrate, and a substrate-temperature controlling step of S1021 of controlling a temperature of the substrate.

As illustrated in FIG. 11B, the second related method of processing a substrate includes in sequence of a first removal step J1, a substrate-temperature controlling step S102 of controlling a temperature of a substrate, a gas-atmosphere applying step S103 of applying gas atmosphere to the substrate, a heating step S104 of heating the substrate, and a substrate-temperature controlling step of S1021 of controlling a temperature of the substrate.

As illustrated in FIG. 11C, the third related method of processing a substrate includes in sequence of a first removal step J1, a second removal step J2, a substrate-temperature controlling step S102 of controlling a temperature of a substrate, a gas-atmosphere applying step S103 of applying gas atmosphere to the substrate, a heating step S104 of heating the substrate, and a substrate-temperature controlling step of S1021 of controlling a temperature of the substrate.

The steps illustrated in each of FIGS. 11A, 11B and 11C define a process of patterning an organic film formed on a substrate.

The first removal step J1 shown in FIGS. 11B and 11C may be comprised of a first chemical-solution step S1, an ashing step S7, or a combination of an ashing step S7 and a first chemical-solution step S1 (these steps are explained later in detail with reference to FIG. 2).

The second removal step J2 shown in FIG. 11C may be comprised of a second chemical-solution step S5, an ashing step S7, or a combination of an ashing step S7 and a second chemical-solution step S5 (these steps are explained later in detail with reference to FIG. 3).

Each of the first removal step J1 and the second removal step J2 is carried out in order to remove an altered layer or a deposited layer both formed on an organic film pattern, to selectively remove only an altered layer or a deposited layer, or to remove an altered layer or a deposited layer to thereby cause a non-altered portion of an organic film pattern to appear.

The substrate-temperature controlling step S102 of controlling a temperature of a substrate may be omitted.

The gas-atmosphere applying step S103 of applying gas atmosphere to a substrate, in the methods shown in FIGS. 11A, 11B and 11C, acts as a fusion/deformation step, namely, has a function of fusing and thereby deforming an organic film pattern.

In the gas-atmosphere applying step S103, an organic film pattern is exposed to gas atmosphere obtained by vaporizing an organic solvent such as alcohol (R—OH), alkoxyalcohol, ether (R—O—R, Ar—O—R, Ar—O—Ar), ester, ketone, glycol, alkylene glycol, and glycol ether (R indicates an alkyl group or a substituted alkyl group, Ar indicates a phenyl group or an aromatic ring other than a phenyl group), and thus, the organic solvent penetrates the organic film pattern. As a result, the organic film pattern is fused, and thus, liquidized or fluidized (hereinafter, referred to as "chemical-solution fusion reflow"). Thus, the organic film pattern is deformed.

The chemical-solution fusion reflow step causes an organic film pattern to deform in the range of 5 to 20 micrometers. It is sometimes possible to deform an organic film pattern by 100 micrometers or more.

However, since an organic film pattern is much deformed, if the organic film pattern is required to be accurately patterned, it would be necessary to accurately control the deformation of the organic film pattern.

In order to reduce a number of photolithography steps, there may be used an organic film pattern (specifically, a resist pattern) for forming a source and a drain in a channel. The fusion/deformation step is used for deforming two separate portions of the resist pattern located in the vicinity of a channel, corresponding to the source and drain, thereby unifying the separate two portions to each other.

It is necessary to cause much "chemical-solution fusion reflow" in order to stably unify the separate two portions to each other. However, if "chemical-solution fusion reflow" is carried out so much, a resist pattern associated with portions other than a channel, such as wirings, would be much fused and deformed.

Accordingly, it was necessary to design a resist pattern to have two portions having different thicknesses from each other, and to remove a thinner portion of the resist pattern before carrying out the fusion/deformation step.

However, since an organic film pattern would have an increased area due to the fusion/deformation step, it would be necessary to accurately control a time for carrying out the fusion/deformation step to thereby control accurately the deformation of an organic film pattern, in order to prevent an area of the organic film pattern from increasing.

Though there is a need for a process which is capable of reducing costs and saving energies and resources, there were not suggested an effective apparatus and method for doing so.

SUMMARY OF THE INVENTION

In view of the above-mentioned problems in the related art, it is an exemplary object of the present invention to provide an apparatus for processing a substrate which is capable of preventing an organic film pattern from having an unnecessarily increased area in the fusion/deformation step, and accurately controlling deformation of an organic film pattern.

It is also an exemplary object of the present invention to provide a method of processing a substrate, and a chemical solution used in the method both of which are capable of doing the same as mentioned above.

In the apparatus and the method both in accordance with the present invention, a fusion/deformation step (specifically, a gas-atmosphere applying step) is carried out similarly to the above-mentioned related method, but thereafter, a part of an organic film pattern (for instance, a resist pattern) having an area having been increased more than necessary due to fusion/deformation reflow, that is, an unnecessary portion of an organic film pattern is removed.

Hereinbelow are explained an apparatus for processing a substrate, a method of doing the same, and a chemical solution used in the method all in accordance with the present invention.

The apparatus for processing a substrate in accordance with the present invention is designed to have processing units selected for carrying out the method of processing a substrate, and to control the processing units to operate in an order corresponding to an order in which steps defining the method are carried out.

In a first exemplary aspect of the present invention, there is provided an apparatus for processing a substrate, including a gas-atmosphere applying unit for applying gas atmosphere to the substrate, and a light-exposure unit for exposing the substrate to light through a lower surface of the substrate.

There is further provided an apparatus for processing a substrate, including a light-exposure unit for exposing the substrate to light through a lower surface of the substrate, and a chemical-solution applying unit for applying chemical solution to the substrate.

There is still further provided an apparatus for processing a substrate, including a substrate carrier for carrying the substrate, a gas-atmosphere applying unit for applying gas atmosphere to the substrate, a third processing unit for applying a third removal step to the substrate, and a controller for controlling the substrate carrier, the gas-atmosphere applying unit and the third processing unit such that a step of applying gas atmosphere to the substrate, to be carried out by the gas-atmosphere applying unit, and the third removal step to be carried out by the third processing unit are carried out in this order.

In a second exemplary aspect of the present invention, there is provided a method of processing an organic film pattern formed on a substrate, comprising, in sequence of, a fusion/deformation step of fusing and thereby deforming the organic film pattern, and a third removal step of removing at least a part of the fused and deformed organic film pattern.

In a third exemplary aspect of the present invention, there is provided a method of fabricating an apparatus including a substrate processed in accordance with the above-mentioned method.

In a fourth exemplary aspect of the present invention, there is provided a chemical solution used in a first chemical-solution step, containing at least one of acid chemical, organic solvent, alkaline chemical, amine, organic solvent and amine, and alkaline chemical and amine.

For instance, an unnecessary portion of an organic film pattern is removed by an ashing step and a chemical-solution step alone or in combination. In the chemical-solution step, there is used chemical solution having a function of developing an organic film pattern or a function of separating an organic film pattern.

If necessary, a step of removing an altered layer or a deposited layer formed on a surface of an organic film pattern may be carried out before the fusion/deformation step.

Specifically, in the method in accordance with the present invention, after the fusion/deformation step has been carried out for fusing and thereby deforming an organic film pattern formed on a substrate, an unnecessary portion of the organic film pattern or a portion of the organic film pattern having an area having increased more than necessity is at least partially removed by various removal steps (defined in "third removal step" in claims).

In the above-mentioned related art, an area of an organic film pattern is only increased due to the fusion/deformation reflow, and an increasing rate is controlled by controlling a period of time during which the fusion/deformation reflow is carried out, for instance. In contrast, the present invention makes it possible to control an area of an organic film pattern in opposite ways. That is, the present invention provides the second control to an area of an organic film pattern by removing or contracting the organic film pattern after the fusion/deformation reflow was carried out, ensuring that the deformation of an organic film pattern can be accurately controlled.

In order to reduce a number of photolithography steps in the above-mentioned related art, there was used an organic film pattern (specifically, a resist pattern) for forming a source and a drain in a channel. The fusion/deformation step was used for deforming two separate portions of the resist pattern located in the vicinity of a channel, corresponding to the source and drain, thereby unifying the separate two portions to each other.

However, if the chemical-solution fusion reflow caused by the fusion/deformation step is small, it was not possible to surely unify the separate two portions of an organic film pattern to each other, but there is less generated a portion of an organic film pattern having an area increased more than necessary. If the chemical solution fusion reflow caused by the fusion/deformation step is large, there was much generated a portion of an organic film pattern having an area increased more than necessary, but it is possible to surely unify the separate two portions of an organic film pattern to each other.

In contrast, when the method in accordance with the present invention is used for reducing a number of photolithography steps, the chemical-solution reflow is caused sufficiently large due to the fusion/deformation step, and then, a deformed portion of the organic film pattern is removed or contracted, thereby the deformed portion of the organic film pattern would have a desired area. Thus, the method in accordance with the present invention provides only the merits obtained in the above-mentioned related art.

For instance, the fusion/deformation step may be carried out by causing chemical solution (for instance, organic solvent) to penetrate an organic film pattern formed on a substrate, to thereby deform the organic film pattern.

Specifically, for instance, the fusion/deformation step may be comprised of a gas-atmosphere applying step in which chemical solution (for instance, organic solvent) is gasified by nitrogen ($N_2$) bubbling, and a substrate is exposed to the thus generated gas atmosphere.

Specifically, the fusion/deformation step is carried out in order to enlarge an area of an organic film pattern, unify organic film patterns disposed adjacent to each other, planarize an organic film pattern, or deform an organic film pattern so as to turn the organic film pattern into an electrically insulating film covering a circuit pattern formed on a substrate.

For instance, an organic film pattern to be first formed on a substrate may be formed by printing or photolithography.

Furthermore, it is preferable that an organic film pattern is comprised of a photosensitive organic film, in which case, the photosensitive film may be a positive type photosensitive organic film or a negative type photosensitive organic film.

It is preferable that the positive type photosensitive organic film contain novolak resin as a primary constituent. However, the positive type photosensitive organic film may be composed of resin other than novolak.

The photosensitive organic film may be alkali-soluble when exposed to light.

An underlying film located below an organic film pattern may be patterned by etching with the organic film pattern being used as a mask, before the fusion/deformation step is carried out. When an underlying film located below an organic film pattern is to be patterned again with the organic film pattern having been already processed, being used as a mask, the organic film pattern may be comprised of a film to which at least one of a light-exposure step, a development step, a wet-etching step, and a dry-etching step is applied before the fusion/deformation step is carried out.

The above-mentioned altered layer formed on an organic film pattern is caused when (a) a surface of an organic film pattern is altered due to at least one of aging, thermal oxidation, and heat curing, (b) a surface of an organic film pattern is altered due to etchant used for wet-etching, (c) a surface of an organic film pattern is altered due to dry-etching or ashing, or (d) a surface of an organic film pattern is altered due to deposition caused by dry-etching.

The above-mentioned deposited layer is formed on a surface of an organic film pattern by dry-etching, for instance.

In a first aspect, the method of a processing a substrate, in accordance with the present invention, includes a fusion/deformation step (that is, a gas-atmosphere applying step in which an organic film pattern is exposed to gas atmosphere generated by vaporizing organic solvent), and a third removal step.

Specifically, the method in accordance with the present invention in a first aspect includes, in sequence of, a fusion/deformation step (hereinafter, referred also to "a gas-atmosphere applying step") for fusing and thereby deforming an organic film pattern, and a third removal step.

Furthermore, in order to stably carry out those steps, the method may include a substrate-temperature controlling step of controlling (specifically, lowering) a temperature of a substrate to a suitable temperature before the substrate is processed, and a heating step of heating an organic film pattern to be able to readily bake the organic film pattern after the organic film pattern has been deformed. The heating step of heating the organic film pattern may be carried out by broadening a range of a temperature in which the step of controlling a temperature of a substrate is carried out.

FIG. 1A is a flow chart showing steps to be carried out in the method in accordance with the present invention in a first aspect.

As illustrated in FIG. 1A, the method includes, in sequence of, a first heating step S9 of heating a substrate and therefore an organic film pattern, a substrate-temperature controlling step S2 of controlling a temperature of a substrate and therefore an organic film pattern, a gas-atmosphere applying step S3 of applying gas atmosphere to an organic film pattern, a second heating step S4 of heating a substrate and therefore an organic film pattern, a second substrate-temperature controlling step S21 of controlling a temperature of a substrate and therefore an organic film pattern, a third removal step J3, and a third heating step S8 of heating a substrate and therefore an organic film pattern.

The first heating step S9, the substrate-temperature controlling step S2, the second heating step S4, the second substrate-temperature controlling step S21, and the third heating step S8 embraced with broken-line brackets in FIG. 1A may be omitted.

Furthermore, the first heating step S9, the substrate-temperature controlling step S2, the second heating step S4, the second substrate-temperature controlling step S21, and the third heating step S8 may be carried out by changing a temperature range in a processing unit prepared for carrying out those steps.

As explained above, the method in accordance with the present invention in a first aspect necessarily includes the gas-atmosphere applying step S3 and the third removal step J3, and other steps may be omitted, if necessary.

The method in accordance with the present invention in a second aspect includes a first removal step, a fusion/deformation step (that is, a gas-atmosphere applying step in which an organic film pattern is exposed to gas atmosphere generated by vaporizing organic solvent), and a third removal step.

Specifically, the method in accordance with the present invention in a second aspect includes, in sequence of, a first removal step, a fusion/deformation step (hereinafter, referred also to "a gas-atmosphere applying step") for fusing and thereby deforming an organic film pattern, and a third removal step.

Furthermore, in order to stably carry out those steps, the method may include a substrate-temperature controlling step of controlling (specifically, lowering) a temperature of a substrate to a suitable temperature before the substrate is processed, and a heating step of heating an organic film pattern to be able to readily bake the organic film pattern after the organic film pattern has been deformed. The heating step of heating the organic film pattern may be carried out by broadening a range of a temperature in which the step of controlling a temperature of a substrate is carried out.

FIG. 1B is a flow chart showing steps to be carried out in the method in accordance with the present invention in a second aspect.

As illustrated in FIG. 1B, the method includes, in sequence of, a first removal step J1, a first heating step S9 of heating a substrate and therefore an organic film pattern, a substrate-temperature controlling step S2 of controlling a temperature of the substrate and therefore the organic film pattern, a gas-atmosphere applying step S3 of applying gas atmosphere to the organic film pattern, a second heating step S4 of heating the substrate and therefore the organic film pattern, a second substrate-temperature controlling step S21 of controlling a temperature of the substrate and therefore the organic film pattern, a third removal step J3, and a third heating step S8 of heating the substrate and therefore the organic film pattern.

The first heating step S9, the substrate-temperature controlling step S2, the second heating step S4, the second substrate-temperature controlling step S21, and the third heating step S8 embraced with broken-line brackets in FIG. 1B may be omitted.

Furthermore, the first heating step S9, the substrate-temperature controlling step S2, the second substrate-temperature controlling step S21, the second heating step S4, and the third heating step S8 may be carried out by changing a temperature range in a processing unit prepared for carrying out those steps.

As explained above, the method in accordance with the present invention in a second aspect necessarily includes the first removal step J1, the gas-atmosphere applying step S3 and the third removal step J3, and other steps may be omitted, if necessary.

The method in accordance with the present invention in a third aspect includes a first removal step, a second removal step, a fusion/deformation step (which is comprised of a gas-atmosphere applying step in which an organic film pattern is exposed to gas atmosphere generated by vaporizing organic solvent), and a third removal step.

Specifically, the method in accordance with the present invention in a third aspect includes, in sequence of, a first removal step, a second removal step, a fusion/deformation step (hereinafter, referred also to "a gas-atmosphere applying step") for fusing and thereby deforming an organic film pattern, and a third removal step.

Furthermore, in order to stably carry out those steps, the method may include a substrate-temperature controlling step of controlling (specifically, lowering) a temperature of a substrate to a suitable temperature before the gas-atmosphere applying step is carried out, and a heating step of heating an organic film pattern to be able to readily bake the organic film pattern after the organic film pattern has been deformed. The heating step of heating the organic film pattern may be carried out by broadening a range of a temperature in which the step of controlling a temperature of a substrate is carried out.

FIG. 1C is a flow chart showing steps to be carried out in the method in accordance with the present invention in a third aspect.

As illustrated in FIG. 1C, the method includes, in sequence of, a first removal step J1, a second removal step J2, a first heating step S9 of heating a substrate and therefore an organic film pattern, a substrate-temperature controlling step S2 of controlling a temperature of the substrate and therefore the organic film pattern, a gas-atmosphere applying step S3 of applying gas atmosphere to the organic film pattern, a second heating step S4 of heating the substrate and therefore the organic film pattern, a second substrate-temperature controlling step S21 of controlling a temperature of the substrate and therefore the organic film pattern, a third removal step J3, and a third heating step S8 of heating the substrate and therefore the organic film pattern.

The first heating step S9, the substrate-temperature controlling step S2, the second heating step S4, the second substrate-temperature controlling step S21, and the third heating step S8 embraced with broken-line brackets in FIG. 1C may be omitted.

Furthermore, the first heating step S9, the substrate-temperature controlling step S2, the second substrate-temperature controlling step S21, the second heating step S4, and the third heating step S8 may be carried out by changing a temperature range in a processing unit prepared for carrying out those steps.

As explained above, the method in accordance with the present invention in a third aspect necessarily includes the first removal step J1, the second removal step J2, the gas-atmosphere applying step S3 and the third removal step J3, and other steps may be omitted, if necessary.

Hereinbelow is explained the above-mentioned first removal step J1.

FIGS. 2A, 2B and 2C are flowcharts each showing a step or steps to be carried out in examples of the first removal step J1.

As illustrated in FIG. 2A, a first example of the first removal step J1 is comprised of a first chemical-solution step S1 for applying chemical solution to an organic film pattern.

As illustrated in FIG. 2B, a second example of the first removal step J1 is comprised of an ashing step S7 of ashing an organic film pattern.

As illustrated in FIG. 2C, a third example of the first removal step J1 is comprised of, in sequence, of, an ashing step S7 and a first chemical-solution step S1

Hereinbelow is explained the above-mentioned second removal step J2.

FIGS. 3A, 3B and 3C are flow charts each showing a step or steps to be carried out in examples of the second removal step J2.

As illustrated in FIG. 3A, a first example of the second removal step J2 is comprised of a second chemical-solution step S5 for applying chemical solution to an organic film pattern.

As illustrated in FIG. 3B, a second example of the second removal step J2 is comprised of an ashing step S7 of ashing an organic film pattern.

As illustrated in FIG. 3C, a third example of the second removal step J2 is comprised of, in sequence of, an ashing step S7 and a second chemical-solution step S5.

Hereinbelow is explained the above-mentioned third removal step J3.

FIGS. 4A, 4B, 4C and 4D are flowcharts each showing a step or steps to be carried out in examples of the third removal step J3.

As illustrated in FIG. 4A, a first example of the third removal step J3 is comprised of a second chemical-solution step S5 for applying chemical solution to an organic film pattern.

As illustrated in FIG. 4B, a second example of the third removal step J3 is comprised of an ashing step S7 of ashing an organic film pattern.

As illustrated in FIG. 4C, a third example of the third removal step J3 is comprised of, in sequence of, the first chemical-solution step S1, and the second chemical-solution step S5.

As illustrated in FIG. 4D, a fourth example of the third removal step J3 is comprised of, in sequence of, an ashing step S7, and the second chemical-solution step S5.

The first to third removal steps are carried out for the following purposes:

(A) the above-mentioned alterated or deposited layer formed on a surface of an organic film pattern is selectively removed;

(B) the above-mentioned alterated or deposited layer formed on a surface of an organic film pattern is removed to thereby cause a non-alterated portion of the organic film pattern to appear;

(C) a part of a non-alterated portion of an organic film pattern is removed;

(D) the above-mentioned alterated or deposited layer existing on the fused/deformed organic film pattern or existing around the fused/deformed organic film pattern is selectively removed;

(E) the above-mentioned alterated or deposited layer existing on the fused/deformed organic film pattern or existing around the fused/deformed organic film pattern is selectively removed to thereby cause a non-alterated portion of an organic film pattern to appear;

(F) the above-mentioned alterated or deposited layer existing on the fused/deformed organic film pattern or existing around the fused/deformed organic film pattern is at least removed, and further, a part of the fused/deformed organic film pattern is removed; and (G) the above-mentioned alterated or deposited layer existing on the fused/deformed organic film pattern or existing around the fused/deformed organic film pattern is selectively removed, and further, a part of the fused/deformed organic film pattern is removed.

In the above-mentioned ashing step, films formed on a substrate are etched through the use of at least one of plasma, ozone and ultraviolet rays.

A degree of alteration and a characteristic of an alterated layer depend highly on chemical solution to be used in wet-etching, whether dry-etching is isotropic or anisotropic, whether deposition exists on an organic film pattern, and gas used in dry-etching. Hence, difficulty in removing an alterated layer depends also on those. Thus, an optimal removal step is selected in accordance with a degree of alteration and a characteristic of an alterated layer among the first to third removal steps of the present invention The ashing step is carried out for removing only a surface of the alterated or deposited layer in the first to third removal steps, and the rest of the alterated or deposited layer is preferably removed by the first or second chemical solution step both of which is a wet step.

In comparison with the steps illustrated in FIGS. 2B, 3B and 4B in which the removal step is comprised only of an ashing step, the steps illustrated in FIGS. 2C, 3C and 4D make it possible to shorten a period of time for carrying out an ashing step to an organic film pattern, and further, to prevent a substrate and an organic film pattern from being damaged by an ashing step, providing an advantage that it is possible to remove an alterated or deposited layer firmly formed on an organic film pattern.

The first, second and third heating steps are carried out for the following purposes:

(A) water, acid solution or alkali solution penetrating an organic film pattern before the fusion/deformation step is carried out is removed; and (B) when an adhesive force between an organic film pattern and a substrate or an underlying film is lowered, the adhesive force is enhanced.

For instance, a step of heating an organic film pattern to form the organic film pattern, the first heating step, the second heating step, and the third heating step are carried out under the following conditions:

(A) the first heating step is carried out at a temperature lower than a temperature at which the second heating step is carried out;

(B) a heating step for forming the organic film pattern and the first heating step are carried out at a temperature lower than a temperature at which the second heating step is carried out;

(C) the second heating step is carried out at a temperature lower than a temperature at which the third heating step is carried out;

(D) a heating step for forming the organic film pattern, the first heating step, and the second heating step are carried out at a temperature lower than a temperature at which the third heating step is carried out;

(E) the first heating step is carried out at a temperature lower than a temperature at which the third heating step is carried out;

(F) a heating step for forming the organic film pattern and the first heating step are carried out at a temperature lower than a temperature at which the third heating step is carried out;

(G) a heating step for forming the organic film pattern, the first heating step, the second heating step or the third heating step is carried out at a temperature equal to or smaller than a temperature at which the organic film pattern is cross-linked (for instance, a heating step for forming the organic film pattern, the first heating step, the second heating step or the third heating step is carried out preferably at a temperature in the range of 50 to 150 degrees centigrade both inclusive, and more preferably at a temperature in the range of 100 to 130 degrees centigrade both inclusive); and (H) a heating step for forming the organic film pattern, the first heating step, the second heating step, and the third heating step are carried out for 60 to 300 seconds both inclusive.

The above-mentioned conditions (A) to (F) are carried out for removing an organic film pattern after carrying out the heating step by means of a developing function of the organic film pattern (for instance, when an organic film pattern is comprised of a photosensitive organic film).

The above-mentioned condition (G) shows an example of a temperature for maintaining a function of developing an organic film pattern, and further for enabling an organic film pattern to be well separated from a substrate.

The above-mentioned condition (J) shows an example of a period of time for carrying out the heating step, taking into consideration a yield when a substrate is processed one by one.

The above-mentioned fusion/deformation step may be comprised of the following step, for instance:

(A) a step of enlarging an area of an organic film pattern;

(B) a step of unifying organic film patterns disposed adjacent to each other, into a single pattern;

(C) a step of planarizing an organic film pattern;

(D) a step of deforming an organic film pattern such that the organic film pattern is turned into an electrically insulating film covering a circuit pattern formed on a substrate; and (E) a step of deforming an organic film pattern by causing the organic film pattern to make contact with organic solvent to thereby cause fusion reflow.

As the above-mentioned organic solvent used in the fusion/deformation step, there is used organic solvent containing at least one of the followings (R indicates an alkyl group or a substitutional alkyl group, and Ar indicates a phenyl group or an aromatic ring other than a phenyl group):

alcohol (R—OH);

ether (R—O—R, Ar—O—R, Ar—O—Ar):

ester;

ketone; and glycol ether.

In order to cause the organic solvent to make contact with an organic film pattern (that is, in order to deform an organic film pattern by the fusion reflow), the organic film pattern may be exposed to vapors of the organic solvent, or the organic film pattern may be immersed into the organic solvent.

The vapors of the organic solvent are provided, for instance, by heating the organic solvent, or by bubbling the organic solvent with inert gas (for instance, nitrogen (N.sub.2) gas or argon (Ar) gas). The vapors of the organic solvent are directly applied as they are to an organic film pattern, or are filled in a bomb.

Thus, it is possible to fill a chamber with gas atmosphere of the organic solvent, and to cause the organic film pattern to make contact with the organic solvent by placing a substrate in the chamber.

When an organic film pattern is comprised of a photosensitive organic film, the following conditions may be very important to stably carry out particular steps (for instance, steps to be carried out by means of photosensitivity of an organic film pattern or a developing function of chemical solution):

(A) after an organic film pattern was originally formed on a substrate, the organic film pattern is kept not exposed to light until the fusion/deformation step is carried out; and (B) after an organic film pattern was originally formed on a substrate, the organic film pattern is kept not exposed to light until a step of exposing the organic film pattern to light or a step of exposing the organic film pattern to light through a lower surface of the organic film pattern is carried out.

The above-mentioned conditions are required because, by keeping the organic film pattern not exposed to light, it would be possible to advantageously carry out a step of exposing an organic film pattern to light, a step of exposing an organic film pattern to light through a lower surface of the organic film pattern, and a step of additionally exposing an organic film pattern to light, ensuring that the development step can be advantageously carried out.

The above-mentioned step of additionally exposing an organic film pattern to light is comprised of a step of exposing an organic film pattern to light before or immediately before carrying out at least one of the first and second chemical-solution steps.

The above-mentioned step of exposing an organic film pattern to light through a lower surface of the organic film pattern is carried out between the fusion/deformation step and the third removal step or between the fusion/deformation step and the second chemical solution step.

The above-mentioned step of exposing an organic film pattern to light through a lower surface of the organic film pattern makes it possible to selectively remove an unnecessary portion of an organic film pattern (for instance, a resist pattern) having an area having been increased due to the fusion reflow caused by the fusion/deformation step.

For instance, when an organic film pattern formed above a data line is to be fused to reflow into a fused/deformed organic film pattern, but the resultant organic film pattern is desired not to extend out of a gate line and a data line, the organic film pattern is exposed to light through a lower surface of a substrate. As a result, a first portion of the fused/deformed organic film pattern hidden by a gate line and a data line is not exposed to light, but a second portion of the fused/deformed organic film pattern not hidden by a gate line and a data line (that is, the second portion has a part extending outwardly from a gate line and a data line). Due to the difference as to whether exposed to light or not between the first and second portions, it would be possible to remove the second portion of an organic film pattern by carrying out the development step.

Namely, it is possible to carry out the development step for selectively removing a portion of an organic film pattern in the above-mentioned second chemical-solution step as the third removal step, by using chemical solution having a function of developing the organic film pattern.

It would be possible to effectively remove an unnecessary portion of the fused/deformed organic film pattern by exposing the original organic film pattern to light with a half-tone mask in advance or by carrying out the light-exposure step during the development step.

For instance, an organic film pattern (which will be exposed to light with an ordinary mask or with a half-tone mask) used for forming a data line is kept not exposed to light until the above-mentioned step of exposing the organic film pattern to light through a lower surface of a substrate is carried out. Then, the step of exposing the organic film pattern to light through a lower surface of a substrate is applied to the organic film pattern, and then, the organic film pattern is developed in the second chemical-solution step as the third removal step through the use of chemical solution having a function of developing the organic film pattern.

By optimizing a period of time for carrying out the second chemical-solution step (step of developing the organic film pattern through the use of chemical solution having a function of developing the organic film pattern), it is possible to pattern the fused/deformed organic film pattern only in a data line even after the fusion reflow. It is preferable that a period of time for developing the organic film pattern is minimized enough to completely remove the organic film pattern.

The above-mentioned step of exposing an organic film pattern to light or the above-mentioned step of exposing an organic film pattern to light through a lower surface of the organic film pattern can be carried out (a) with a photomask, (b) without a photomask, or (c) with a photomask having a pattern other than a minute pattern (equal to or smaller than 1 mm)

The above-mentioned step of exposing an organic film pattern to light may be comprised of (A) a step of ordinarily exposing an organic film pattern to light, (B) a step of exposing an organic film pattern to light only in an area associated with a predetermined area of a substrate, (C) a step of exposing an organic film pattern to light at a time only in the above-mentioned area, (D) a step of scanning the above-mentioned area with spot-light, (E) the above-mentioned area is equal to or greater than 1/10 of an area of a substrate, and (F) an organic film pattern is exposed to ultra-violet rays, fluorescence, or natural light.

The above-mentioned steps (A) to (F) may be carried out singly or in combination.

The light-exposure step (a) with a photomask is applied to a photosensitive organic film pattern through the use of chemical solution having a function of developing the organic film pattern, in order to newly form a pattern.

The light-exposure step (b) without a photomask makes it possible to cause a portion or portions of a substrate to be sufficiently exposed to light, even if there is irregularity in exposure of the substrate to light. Namely, the step (b) can substantially overcome such irregularity, ensuring uniformity in a development step to be later carried out.

The above-mentioned first or second chemical-solution step may be comprised of any one of the following steps:

(A) a step of developing an organic film pattern through the use of chemical solution having a function of developing the organic film pattern;

(B) a step of developing an organic film pattern through the use of chemical solution having at least a function of developing the organic film pattern;

(C) a N-th step of developing an organic film pattern, wherein N indicates an integer equal to or greater than two;

(D) a chemical-solution step of applying chemical solution not having a function of developing an organic film pattern, but having a fusing an organic film pattern for removal, to the organic film pattern; and (E) a chemical-solution step of applying chemical solution for removal to an altered or deposited layer formed on a surface of an organic film pattern.

As chemical solution to be used in the first or second chemical-solution step, any one or more of the following chemical solution may be selected.

(1) chemical solution obtained by diluting separating agent;

(2) organic or inorganic alkaline aqueous solution;

(3) alkaline aqueous solution containing TMAH (tetramethyl ammonium hydroxide) as a principal constituent;

(4) alkaline aqueous solution containing at least one of NaOH or CaOH;

(5) chemical solution containing at least acid;

(6) chemical solution containing at least organic solvent;

(7) chemical solution containing at least alkaline;

(8) chemical solution defined in (5), containing at least amine;

(9) chemical solution containing at least organic solvent and amine;

(10) chemical solution defined in (7), containing at least amine and water;

(11) chemical solution containing at least alkaline and amine;

(12) chemical solution defined in (8) to (11), containing, as amine, at least one of monoethyl amine, diethyl amine, triethyl amine, monoisopyl amine, diisopyl amine, triisoply amine, monobutyl amine, dibutyl amine, tributyl amine, hydroxylamine, diethylhydroxylamine, diethylhydroxylamine anhydride, pyridine, and picoline;

(13) chemical solution defined in (8) to (12), containing amine in the range of 0.01 to 10 weight % both inclusive;

(14) chemical solution defined in (8) to (12), containing amine in the range of 0.05 to 5 weight % both inclusive;

(15) chemical solution defined in (8) to (12), containing amine in the range of 0.05 to 2.0 weight % both inclusive; and

(16) chemical solution containing anti-corrosive.

The chemical solution defined in (1) to (16) may be used singly or in combination.

An organic film pattern originally formed on a substrate may have portions having at least two different thicknesses. The originally formed organic film pattern is processed for one of the following purposes:

(A) by applying at least one of the first, second and third removal steps to an organic film pattern, a portion having a smaller thickness is selectively further thinned; and (B) by applying at least one of the first, second and third removal steps to an organic film pattern, a portion having a smaller thickness is selectively removed.

A step of patterning an underlying film disposed beneath an organic film pattern may be carried out before or after or during an organic film pattern is processed. The step of patterning the underlying film is carried out, for instance, in one of the following steps:

(A) a step of patterning an underlying film disposed beneath the organic film pattern through the use of the organic film pattern as a mask before carrying out the fusion/deformation step;

(B) a step of patterning an underlying film disposed beneath the organic film pattern through the use of the organic film pattern as a mask before carrying out the fusion/deformation step, the first removal step or the first heating step;

(C) a step of patterning an underlying film disposed beneath the organic film pattern through the use of the organic film pattern as a mask before carrying out the third removal step, the second heating step or the third heating step;

(D) a step of patterning an underlying film disposed beneath the organic film pattern through the use of the organic film pattern as a mask before the organic film pattern is processed; and (E) a step of patterning an underlying film disposed beneath the organic film pattern through the use of the organic film pattern as a mask after the organic film pattern has been processed.

The above-mentioned steps (A) to (E) may be carried out once or a plurality of times for patterning an underlying film.

An underlying film is processed for the following purposes:

(A) an underlying film is processed to be tapered or stepliked; and (B) an underlying film is comprised of a plurality of films, and any one or more of the films is (are) patterned to have different patterns from others by processing the underlying film.

The apparatus for processing a substrate in accordance with the present invention is comprised of a substrate carrier for carrying a substrate, processing units optimal for carrying out the above-mentioned method of processing a substrate in accordance with the present invention, selected among a plurality of processing units prepared for carrying out the steps illustrated in FIGS. 1A to 1C, 2A to 2C, 3A to 3C and 4A to 4D, and a controller which operates the selected processing units in an order associated with the method of processing a substrate.

The following processing units are prepared for carrying out the steps illustrated in FIGS. 1A to 1C, 2A to 2C, 3A to 3C and 4A to 4D:

(a) a substrate-temperature controlling unit for controlling a temperature of a substrate and therefore an organic film pattern;

(b) a gas-atmosphere applying unit for applying gas atmosphere to an organic film pattern;

(c) a heating unit for heating an organic film pattern;

(d) a chemical-solution unit for carrying out a first, second or third chemical-solution step;

(e) a development unit used when first, second and third chemical-solution steps are comprised of a step of developing an organic film pattern;

(f) an ashing unit for ashing an organic film pattern;

(g) a light-exposure unit for exposing an organic film pattern to light; and (h) a back light-exposure unit for exposing an organic film pattern to light through a lower surface of a substrate.

A substrate-temperature controlling unit may be used as a heating unit and vice versa, if a range of a temperature during which a step of controlling a temperature of a substrate and a step of heating an organic film pattern are carried out is within an allowable range of a temperature of the unit, by changing a temperature to a temperature at which the former or latter step is to be carried out.

If the same step is to be carried out at a plurality of times in the method in accordance with the present invention, the same processing unit may be operated at a plurality of times.

In contrast, in order to enhance a processing yield, the same step may be carried out in parallel in a plurality of processing units.

In the explanation made above, the present invention is applied to a method of processing a substrate such as a semiconductor substrate or a liquid crystal substrate. It should be noted that the present invention may be applied to:

(a) a method of and an apparatus for fabricating a device including a substrate processed in accordance with the above-mentioned method or apparatus for processing a substrate;

(b) a method of and an apparatus for fabricating a display device;

(c) a method of and an apparatus for fabricating a semiconductor device;

(d) a method of and an apparatus for fabricating a liquid crystal display device;

(e) a method of and an apparatus for fabricating an electroluminescence (EL) display device;

(f) a method of and an apparatus for fabricating a field emission display device; or (g) a method of and an apparatus for fabricating a plasma display device.

In the explanation made above, the present invention is applied to a substrate. It should be noted that the present invention may be applied to a method of fabricating a liquid crystal display device (a vertical electric field type liquid crystal display device, a horizontal electric field type liquid crystal display device, a light-transmission type liquid crystal display device, a light-reflection type liquid crystal display device, and a half-transmission type liquid crystal display device), and a display device such as an EL display device, or a method of fabricating other semiconductor devices.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1A is a flow chart showing steps to be carried out in the method in accordance with First Example of the present invention.

FIG. 1B is a flow chart showing steps to be carried out in the method in accordance with Second Example of the present invention.

FIG. 1C is a flow chart showing steps to be carried out in the method in accordance with Third Example of the present invention.

FIG. 2A is a flow chart showing steps to be carried out in a first example of the first removal step.

FIG. 2B is a flow chart showing steps to be carried out in a second example of the first removal step.

FIG. 2C is a flow chart showing steps to be carried out in a third example of the first removal step.

FIG. 3A is a flow chart showing steps to be carried out in a first example of the second removal step.

FIG. 3B is a flow chart showing steps to be carried out in a second example of the second removal step.

FIG. 3C is a flow chart showing steps to be carried out in a third example of the second removal step.

FIG. 11A shows steps to be carried out in the first related method.

FIG. 11B shows steps to be carried out in the second related method.

FIG. 11C shows steps to be carried out in the third related method.

FIGS. 18A, 18B, 18C, 18D, 18E, 18F and 18G are plan and cross-sectional views of a thin film transistor (TFT) device in a related method of fabricating a TFT substrate, including a fusion/deformation/reflow process.

FIGS. 19A, 19B, 19C, 19D, 19E, 19F and 19G are plan and cross-sectional views of a thin film transistor (TFT) device in a method of fabricating a TFT substrate, in accordance with Fourth Example of the present invention.

FIGS. 20A, 20B, 20C, 20D, 20E, 20F and 20G are plan and cross-sectional views of a thin film transistor (TFT) device in a method of fabricating a TFT substrate, in accordance with Fifth Example of the present invention.

DETAILED DESCRIPTION

Preferred embodiments in accordance with the present invention will be explained hereinbelow with reference to drawings.

Figure 5:
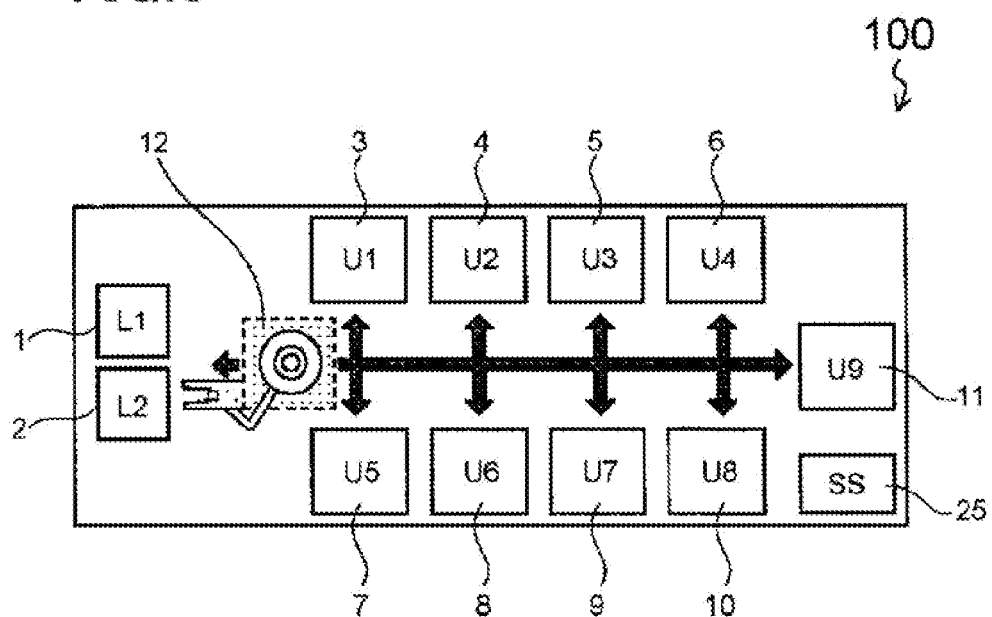
FIG. 5 is a planar view of a first example of an apparatus for processing a substrate.
Figure 6:
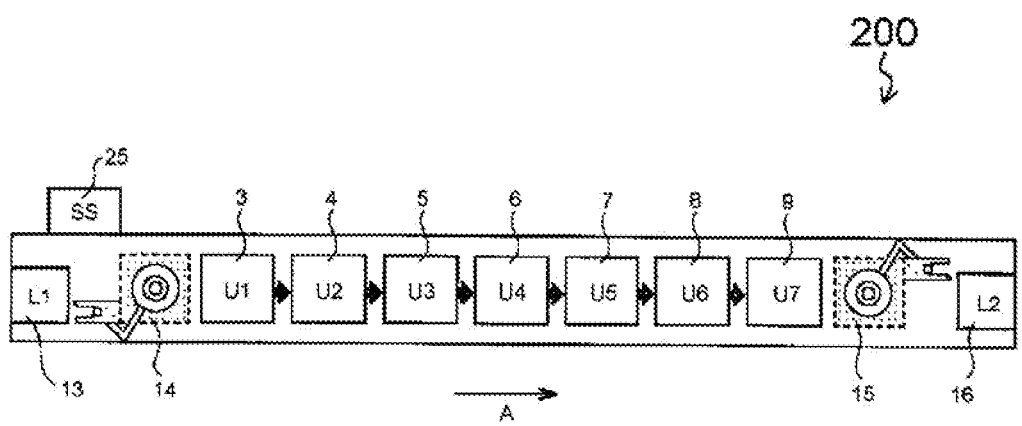
FIG. 6 is a planar view of a second example of an apparatus for processing a substrate.

The method in accordance with an embodiment of the present invention is carried out in an apparatus 100 for processing a substrate, illustrated in FIG. 5 or an apparatus 200 for processing a substrate, illustrated in FIG. 6, for instance.

The apparatus 100 illustrated in FIG. 5 includes a plurality of processing units, and an order in which the processing units are operated is variable.

The apparatus 200 illustrated in FIG. 6 includes a plurality of processing units, and an order in which the processing units are operated is fixed.

The apparatuses 100 and 200 are designed to be able to selectively have later-mentioned processing units to apply various steps to a substrate.

Figure 7:
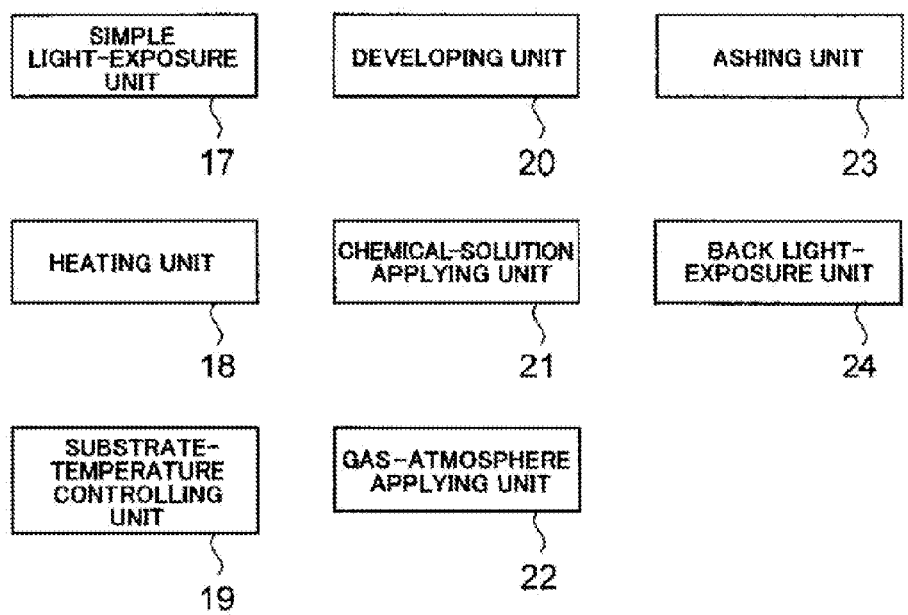
FIG. 7 is a schematic view showing candidates of processing units to be equipped in an apparatus for processing a substrate.

For instance, as illustrated in FIG. 7, the apparatuses 100 and 200 may include eighth processing units, specifically, a simple light-exposure unit 17 for exposing an organic film pattern to light, a heating unit 18 for heating an organic film pattern, a substrate-temperature controlling unit 19 for controlling a temperature of a substrate and therefore a temperature of an organic film pattern, a developing unit 20 for developing an organic film pattern, a chemical-solution applying unit 21 for applying chemical solution to an organic film pattern, a gas-atmosphere applying unit 22 for applying gas atmosphere to an organic film pattern, an ashing unit 23 for applying ashing to an organic film pattern, and a back light-exposure unit 24 for exposing an organic film pattern to light through a lower surface of a substrate.

The apparatus 100 or 200 is comprised of a substrate carrier (a substrate-carrier robot), a cassette station in which a cassette is placed, and one or more processing units selected among the above-mentioned eight processing units.

In the light-exposure unit 17 for exposing an organic film pattern to light, an organic film pattern formed on a substrate is exposed to light.

For instance, the light-exposure step of can be carried out in the light-exposure unit 17 (a) with a photomask, (b) without a photomask, or (c) with a photomask having a pattern other than a minute pattern (equal to or smaller than 1 mm)

The step of exposing an organic film pattern to light may be comprised of (A) a step of ordinarily exposing an organic film pattern to light, (B) a step of exposing an organic film pattern to light only in an area associated with a predetermined area of a substrate, (C) a step of exposing an organic film pattern to light at a time only in the above-mentioned area, (D) a step of scanning the above-mentioned area with spot-light, (E) the above-mentioned area is equal to or greater than 1/10 of an area of a substrate, and (F) an organic film pattern is exposed to ultra-violet rays, fluorescence, or natural light, singly or in combination.

The light-exposure unit 17 exposes an organic film pattern to light in accordance with the above-mentioned steps (A) to (F) singly or in combination.

The light-exposure step (a) with a photomask is applied to a photosensitive organic film pattern through the use of chemical solution having a function of developing the organic film pattern, in order to newly form a pattern.

The light-exposure step (b) without a photomask makes it possible to cause a portion or portions of a substrate to be sufficiently exposed to light, even if there is irregularity in exposure of the substrate to light. Namely, the step (b) can substantially overcome such irregularity, ensuring uniformity in a development step to be later carried out.

In the heating unit 18 for heating an organic film pattern, a substrate and therefore an organic film pattern are heated or baked in the range of 80 to 180 degrees centigrade both inclusive, for instance, and preferably in the range of 100 to 150 degrees centigrade both inclusive.

The heating unit 18 may be comprised of a stage on which a substrate is held horizontally, and a chamber in which the stage is arranged.

The substrate-temperature controlling unit 19 controls a temperature of a substrate and therefore an organic film pattern.

For instance, the substrate-temperature controlling unit 19 keeps a substrate and an organic film pattern in the range of 10 to 80 degrees centigrade both inclusive, for instance, and preferably in the range of 10 to 50 degrees centigrade both inclusive, and more preferably in the range of 20 to 30 degrees centigrade both inclusive. The substrate-temperature controlling unit 19 can keep substrate and an organic film pattern at a temperature higher than the above-mentioned temperatures.

The substrate-temperature controlling unit 19 can keep a substrate at a temperature in the range of .+−0.2 degrees centigrade of a target temperature, and preferably at a temperature in the range of .+−0.1 degrees centigrade of a target temperature.

The substrate-temperature controlling unit 19 is comprised of a stage on which a substrate is held horizontally, and a chamber in which the stage is arranged.

The heating unit 18 and the substrate-temperature controlling unit 19 can control a broad range of a temperature. Hence, if one of them can control a temperature from a high temperature to a low temperature (for instance, 10 to 180 degrees centigrade), it can carry out the temperature control in place of the other by changing a range of a temperature to be controlled.

In the chemical-solution applying unit 21, chemical solution is applied to an organic film pattern.

Figure 8:
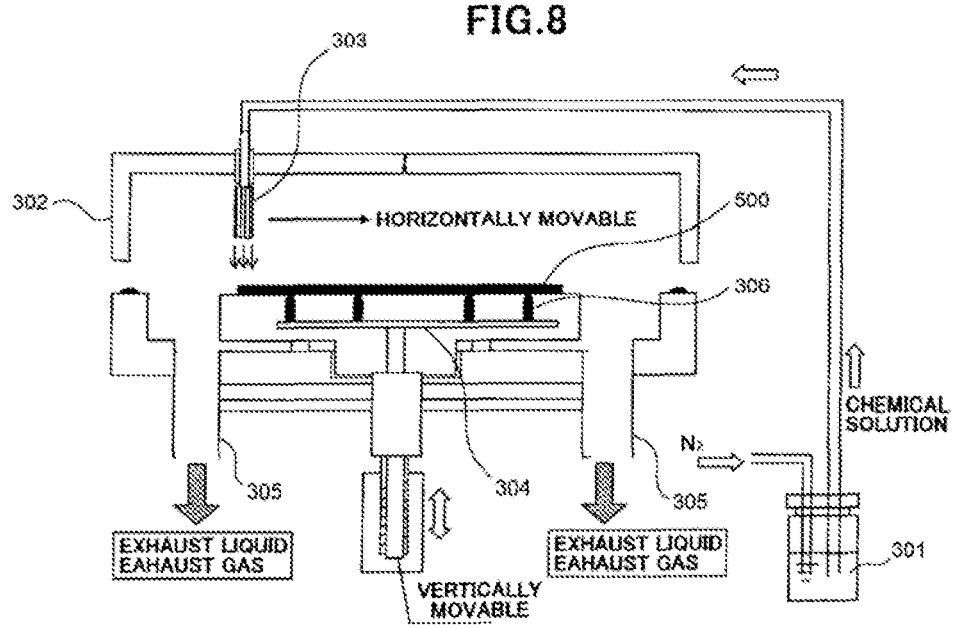
FIG. 8 is a cross-sectional view of an example of a chemical-solution applying unit for applying chemical solution to an organic film pattern, or a developing unit.

FIG. 8 is a cross-sectional view of an exemplary structure of the chemical-solution applying unit 21.

As illustrated in FIG. 8, the chemical-solution applying unit 21 is comprised of, for instance, a chemical solution tank 301 in which chemical solution is accumulated, and a chamber 302 in which a substrate 500 is arranged.

The chamber 302 includes a movable nozzle 303 for supplying chemical solution transported from the chemical solution tank 301, onto the substrate 500, a stage 304 on which the substrate 500 is held substantially horizontally, and an exhaust outlet 305 through which exhaust liquid and exhaust gas leave the chamber 302.

The movable nozzle 303 is designed to be horizontally movable in the chamber 302

In the chemical-solution applying unit 21, chemical solution accumulated in the chemical solution tank 301 can be vaporized by compressing nitrogen gas into the chemical solution tank 301, that is, by bubbling the chemical solution with nitrogen gas. The vaporized chemical solution is supplied onto the substrate 500 through the movable nozzle 303.

The stage 304 includes a plurality of standing pins for supporting the substrate 500 at a lower surface thereof.

The stage 304 is designed to be vertically movable. Thus, the stage 304 puts the substrate 500 at a variable height in the chamber 302.

The chemical-solution applying unit 21 may be designed to be of a dry type in which chemical is vaporized, and the thus vaporized chemical is supplied onto the substrate 500.

For instance, chemical solution used in the chemical-solution applying unit 21 (namely, chemical solution accumulated in the chemical solution tank 301) contains at least one of acid solution, organic solvent and alkaline solution.

In the developing unit 20 for developing an organic film pattern, an organic film pattern is developed or overdeveloped.

For instance, the developing unit 20 may be designed to have the same structure as that of the chemical-solution applying unit 21 except that developing agent is accumulated in the chemical solution tank 301. In other words, the chemical-solution applying unit 21 may be used as the developing unit 20 by accumulating developing agent in the chemical solution tank 301.

In the gas-atmosphere applying unit 22, there is carried out a gas-atmosphere applying step in which various gases are applied to an organic film pattern to thereby fuse and deform the organic film pattern (fusion/deformation step).

Figure 9:
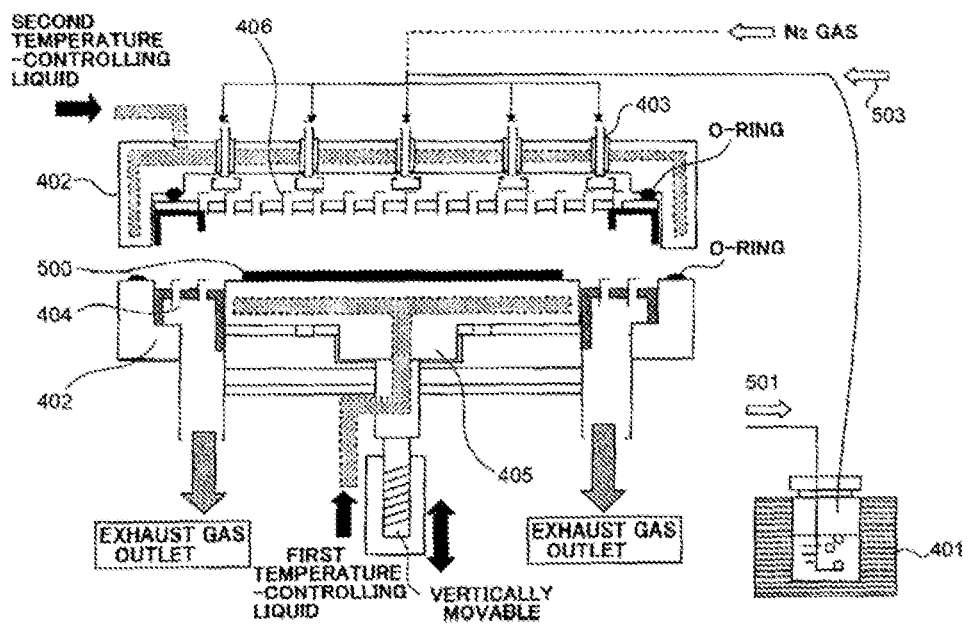
FIG. 9 is a cross-sectional view of a first example of a gas-atmosphere applying unit for applying gas atmosphere to an organic film pattern.
Figure 10:
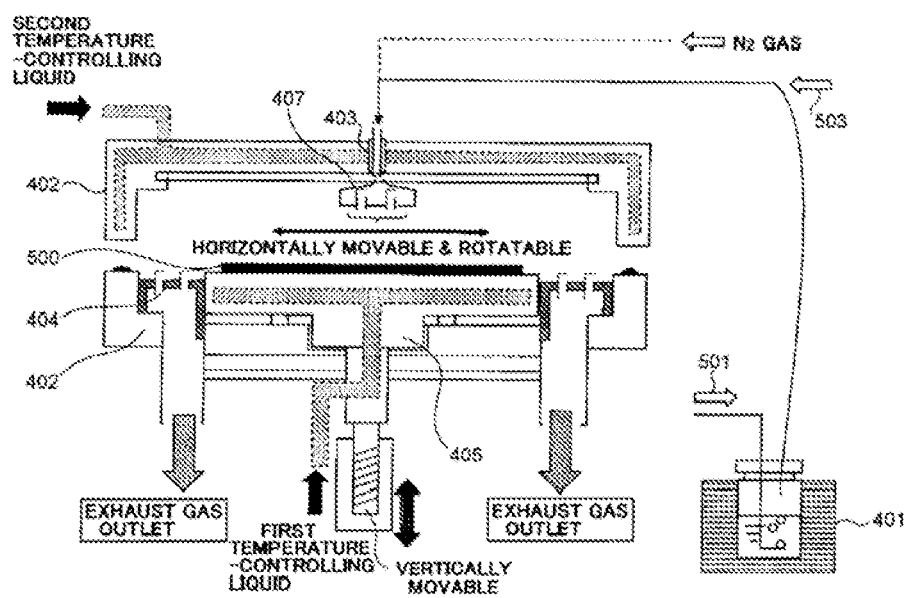
FIG. 10 is a cross-sectional view of a second example of a gas-atmosphere applying unit for applying gas atmosphere to an organic film pattern.

FIGS. 9 and 10 are cross-sectional views of an exemplary structure of the gas-atmosphere applying unit 22.

As illustrated in FIGS. 9 and 10, the gas-atmosphere applying unit 22 may be comprised of a container 401 in which a gas is produced by bubbling, and a chamber 402 in which a substrate 500 is arranged.

The chamber 402 includes a gas inlet 403 through which a gas is introduced into the chamber 402 from the container 401, an exhaust outlet 404 through which gas is exhausted from the chamber 402, a stage 405 for substantially horizontally holding the substrate 500, and a temperature controller (not illustrated) for keeping the chamber 402 and the container 401 at a predetermined temperature.

The chamber 402 may include a plurality of gas inlets 403 located at different positions from one another, and a gas distribution plate 406 having a plurality of apertures formed therethrough for dispersing and distributing gas onto the substrate 500 supported on the stage 405, as illustrated in FIG. 9.

As an alternative, the chamber 402 may include a single gas inlet 403, and a distributor 407 distributing gas supplied through the gas inlet 403, by rotation, and horizontally movable in the chamber 402, as illustrated in FIG. 10.

In the gas-atmosphere applying unit 22, liquid (for instance, organic solvent) accumulated in the container 401 is bubbled by introducing nitrogen gas thereinto, gas produced by bubbling the liquid is introduced into the chamber 402 through the gas inlet 403, and the substrate 500 is exposed to the gas.

In the ashing unit 23, an organic film pattern formed on the substrate 500 is etched by plasma (oxygen plasma or oxygen/fluorine plasma), optical energy of light having a short wavelength, such as ultra-violet ray, ozone-processing using optical energy or heat, or other steps.

In the back light-exposure unit 24, an organic film pattern formed on a substrate is exposed to light through a lower surface of the substrate.

The back light-exposure unit 24 has the same structure as that of the simple light-exposure unit 17. Accordingly, the simple light-exposure unit 17 may be substituted for the back light-exposure unit 24.

As illustrated in FIG. 5, the apparatus 100 is comprised of a first cassette station 1 in which a cassette L1 in which a substrate (for instance, a LCD substrate or a semiconductor wafer) is accommodated is placed, a second cassette station 2 in which a cassette L2 similar to the cassette L1 is placed, processing unit arrangement areas 3 to 11 in each of which processing units U1 to U9 is arranged, respectively, a robot 12 (a substrate carrier) for transporting a substrate between the first and second cassette stations 1 and 2 and the processing units U1 to U9, and a controller 25 for controlling the robot 12 to transport a substrate, and the processing units U1 to U9 to carry out various processes.

For instance, substrates not yet processed by the apparatus 100 are accommodated in the cassette L1, and substrates having been processed by the apparatus 100 are accommodated in the cassette L2.

Any one of the eight processing units illustrated in FIG. 7 is selected as each of the processing units U1 to U9 to be arranged in the processing unit arrangement areas 3 to 11.

The number of processing units is determined in accordance with a kind of process and a capacity of a processing unit. Accordingly, no processing unit may be arranged in any one or more of the processing unit arrangement areas 3 to 11.

For instance, the controller 25 is comprised of a central processing unit (CPU) and at least one memory. The memory stores a control program used for controlling an operation of the processing units U1 to U9 and the robot 12. The central processing unit controls the processing units U1 to U9 and the robot 12 in accordance with the control program.

The controller 25 selects a program in accordance with a process to be carried out in each of the processing units U1 to U9 and the robot 12, and executes the selected program to thereby control operation of the processing units U1 to U9 and the robot 12.

Specifically, the controller 25 controls an order of transportation of a substrate carried out by the robot 12, in accordance with data about an order of processes, to thereby take a substrate out of the first and second cassette station 1 and 2 and the processing units U1 to U9, and introduces a substrate into them in accordance with a predetermined order.

Furthermore, the controller 25 controls an operation of the processing units U1 to U9 in accordance with data about process conditions.

In the apparatus 100 illustrated in FIG. 5, an order in which the processing units U1 to U9 are operated is variable.

In the apparatus 200 illustrated in FIG. 6, an order in which the processing units U1 to U7 are operated is fixed.

As illustrated in FIG. 6, the apparatus 200 is comprised of a first cassette station 13 in which a cassette L1 is placed, a second cassette station 16 in which a cassette L2 is placed, processing unit arrangement areas 3 to 9 in each of which processing units U1 to U7 is arranged, respectively, a first robot 14 for transporting a substrate between the cassette L1 and the processing unit U1, a second robot 15 for transporting a substrate between the processing unit U7 between the cassette L2, and a controller 25 for controlling operation of the first and second robots 14 and 15 to transport of a substrate and the processing units U1 to U7 to carry out various processes.

In the apparatus 200, an order of processes carried out in the processing units U1 to U7 is fixed. Specifically, processes are continuously carried out from a processing unit located upstream, that is, in a direction indicated with an arrow A in FIG. 6.

Any one of the seven processing units illustrated in FIG. 7 is selected as each of the processing units U1 to U7 to be arranged in the processing unit arrangement areas 3 to 9.

The number of processing units is determined in accordance with a kind of process and a capacity of a processing unit. Accordingly, no processing unit may be arranged in any one or more of the processing unit arrangement areas 3 to 9.

The controller 25 of the apparatus 200 controls the robot 12 such that an order of carrying a substrate is determined in accordance with a fixed order of processing a substrate. Specifically, the controller 25 of the apparatus 200 controls the robot 12 such that a substrate is taken out of or carried into the first and second cassette stations 1 and 2 and the processing units U1 to U7 in a predetermined order.

Furthermore, the controller 25 of the apparatus 200 carries out processes in the processing units U1 to U7 in a predetermined order determined in accordance with fixedly determined process conditions in a method of processing a substrate.

As mentioned above, the apparatuses 100 and 200 suitable for carrying out the method of processing a substrate are designed to include a robot acting as a substrate-carrier, a cassette holder (a cassette station), and processing units selected among the eight processing units 17-24 illustrated in FIG. 7.

Though the apparatuses 100 and 200 illustrated in FIGS. 5 and 6 are designed to include nine and seven processing units, respectively, the number of processing units to be included in the apparatuses 100 and 200 may be determined in accordance with a kind of a process, a capacity of a processing unit, costs and so on.

Furthermore, though the apparatuses 100 and 200 are designed to include two cassettes L1 and L2, the number of cassettes may be determined in accordance with a required capacity, costs and so on.

The apparatuses 100 and 200 may include a processing unit or processing units other than the eight processing units illustrated in FIG. 7. For instance, the apparatuses 100 and 200 may include a processing unit for exposing a substrate to light for making a minute pattern, a processing unit for wet- or dry-etching a substrate, a processing unit for coating a resist film onto a substrate, a processing unit for strengthening an adhesion force between a substrate and an organic film pattern (for instance, a processing unit using an agent for strengthening an adhesion force between a substrate and an organic film pattern), or a processing unit for washing a substrate (dry washing through ultra-violet ray or plasma, and wet washing through a washing agent).

If the apparatuses 100 and 200 include a processing unit for wet-etching or dry-etching a substrate, it would be possible to pattern an underlying film (for instance, a surface of a substrate) with an organic film pattern being used as a mask.

The chemical-solution applying unit 21 may be used as a processing unit for wet- or dry-etching a substrate, if the chemical-solution applying unit 21 includes chemical by which an underlying film can be etched, specifically, etchant containing acid or alkali.

In order to uniformize each of processes, the apparatuses 100 and 200 may include a plurality of common processing units for applying common process to a substrate a plurality of times.

When the apparatuses 100 and 200 include a plurality of common processing units for applying common process to a substrate a plurality of times, it is preferable that a substrate is processed in the common processing units such that the substrate is directed in different directions from one another (for instance, oppositely) in the common processing units.

In such a case, the apparatuses 100 and 200 are preferably designed to have a function of directing a substrate differently in the processing units, ensuring that a substrate is turned in different directions not manually, but automatically.

For instance, a substrate can be turned in different directions in a plane defined by the substrate by designing the stage 405 illustrated in FIGS. 9 and 10 to be rotatable around a central axis thereof.

When the apparatuses 100 and 200 include a single certain processing unit, it is preferable that a substrate is processed in the processing unit a plurality of times with the substrate being directed in different directions from one another in each of the times.

For instance, it is preferable that a substrate is processed in a plurality of directions opposite to each other, in which case, the apparatuses 100 and 200 are preferably designed to have a function of processing a substrate in a certain processing unit with the substrate being directed in different directions from one another in each of the times.

It is also preferable that a substrate is processed in a processing unit in a first direction and further in a second direction different from the first direction, in which case, the apparatuses 100 and 200 are preferably designed to have a function of doing so.

Hereinbelow are explained examples of the method of processing a substrate.

First Example

Hereinbelow is explained the method of a processing a substrate, in accordance with First Example.

The method in accordance with First Example is carried out for the following purposes (a) to (c):

(a) when an underlying film (for instance, a substrate) is etched with an organic film pattern (for instance, a resist film) being used as a mask, the underlying film is etched to be tapered (for instance, see Japanese Patent Application Publication No. 2002-334830), or etched in a minute size (an organic film pattern is enlarged with respect to an area, or a contact hole is reduced with respect to a size to thereby reduce an etching size);

(b) when an underlying film (for instance, a substrate) is etched with an organic film pattern (for instance, a resist film) being used as a mask, the underlying film is etched into a two-layered structure, two patterns different from each other, or a combination of a separate pattern and combined patterns (for instance, see FIGS. 2 and 3 of the above-mentioned Japanese Patent Application Publication No. 2002-334830), by etching the underlying film prior to and subsequently to a fusion/deformation step; and (c) when an organic film pattern is electrically insulating, the organic film pattern is deformed to cause the organic film pattern to act as an electrically insulating film covering a circuit pattern formed on a substrate.

The method in accordance with First Example provides steps of processing an organic film pattern for accomplishing the above-mentioned purposes (a) to (c).

FIG. 1A is a flow chart showing steps to be carried out in the method in accordance with First Example.

As illustrated in FIG. 1A, the method includes, in sequence of, a first heating step S9 of heating a substrate and therefore an organic film pattern, a substrate-temperature controlling step S2 of controlling a temperature of a substrate and therefore an organic film pattern, a gas-atmosphere applying step S3 of applying gas atmosphere to an organic film pattern, a second heating step S4 of heating a substrate and therefore an organic film pattern, a second substrate-temperature controlling step S21 of controlling a temperature of a substrate and therefore an organic film pattern, a third removal step J3, and a third heating step S8 of heating a substrate and therefore an organic film pattern.

The first heating step S9, the substrate-temperature controlling step S2, the second heating step S4, the second substrate-temperature controlling step S21, and the third heating step S8 embraced with broken-line brackets in FIG. 1B may be omitted.

Furthermore, the first heating step S9, the substrate-temperature controlling step S2, the second heating step S4, the second substrate-temperature controlling step S21, and the third heating step S8 may be carried out by changing a temperature range in a processing unit prepared for carrying out those steps.

The method in accordance with First Example can have variants as follows.

(Variant 1)

The method in accordance with the variant 1 includes, in sequence of, a gas-atmosphere applying step S3 of exposing an organic film pattern to gas atmosphere to thereby fuse and deform the organic film pattern, and a third removal step J3 of removing at least a part of the fused/deformed organic film pattern.

(Variant 2)

The method in accordance with the variant 2 includes, in sequence of, a gas-atmosphere applying step S3 of exposing an organic film pattern to gas atmosphere to thereby fuse and deform the organic film pattern, a second heating step S4 of heating the fused/deformed organic film pattern, and a third removal step J3 of removing at least a part of the fused/deformed organic film pattern.

(Variant 3)

The method in accordance with the variant 3 includes, in sequence of, a gas-atmosphere applying step S3 of exposing an organic film pattern to gas atmosphere to thereby fuse and deform the organic film pattern, a second heating step S4 of heating the fused/deformed organic film pattern, a third removal step J3 of removing at least a part of the fused/deformed organic film pattern, a third heating step S8 of heating the fused/deformed organic film pattern.

(Variant 4)

The method in accordance with the variant 4 includes, in sequence of, a first heating step S9 of heating an organic film pattern, a gas-atmosphere applying step S3 of exposing the organic film pattern to gas atmosphere to thereby fuse and deform the organic film pattern, a second heating step S4 of heating the fused/deformed organic film pattern, a third removal step J3 of removing at least a part of the fused/deformed organic film pattern, a third heating step S8 of heating the fused/deformed organic film pattern.

The variants 1 to 4 may include a substrate-temperature controlling step S2 of keeping a temperature of a substrate constant. The substrate-temperature controlling step S2 is carried out immediately before the fusion/deformation step S3.

As explained above, the method in accordance with First Example necessarily includes the gas-atmosphere applying step S3 and the third removal step J3, and other steps may be omitted, if necessary.

In the gas-atmosphere applying step S3, a substrate is exposed in the gas-atmosphere applying unit 22 to various gases (for instance, gas originated from organic solvent) to thereby carry out the fusion/deformation step in which an organic film pattern formed on a substrate is fused and thereby deformed.

For instance, the gas-atmosphere applying step S3 is carried out in gas atmosphere originated from organic solvent.

In the embodiments or examples mentioned hereinbelow, the fusion/deformation step is carried out as a gas-atmosphere applying step in which the following organic solvents are used. Hence, the fusion/deformation step is treated as being identical to the gas-atmosphere applying step or as having the same function as the gas-atmosphere applying step.

List 1 shows organic solvent to be preferably used in the gas-atmosphere applying step S3.

[List 1]

Alcohol (R—OH)
Alkoxy alcohol
Ether (R—O—R, Ar—O—R, Ar—O—Ar)
Ester
Keton
Glycol
Alkylene glycol
Glycol ether In List 1, R indicates an alkyl group or a substitutional alkyl group, and Ar indicates a phenyl group or an aromatic ring other than a phenyl group.

List 2 shows specific organic solvent to be preferably used in the gas-atmosphere applying step S3.

[List 2]

$CH_3OH$, $C_2H_5OH$, $CH_3(CH_2)XOH$
Isopropyl alcohol (IPA)
Ethoxy ethanol
Methoxy alcohol
Long-chain alkyl ester
Monoethanol amine (MEA)
Monoethyl amine
Diethyl amine
Triethyl amine
Monoisopropyl amine
Diisopropyl amine
Triisoproply amine
Monobutyl amine
Dibutyl amine
Tributyl amine
Hydroxylamine
Diethylhydroxylamine
Diethylhydroxylamine anhydride
pyridine
picoline
acetone
Acetyl acetone
Dioxane
Ethyl Acetate
Buthyl acetate
Toluene
Methylethyl ketone (MEK)
Diethyl ketone
Dimethyl sulfoxide (DMSO)
Methylisobutyl ketone (MIBK)
Butyl carbitol
n-butylacetate (nBA)
Gammerbutyrolactone
Ethylcellosolve acetate (ECA)
Ethyl lactate
Pyruvate ethyl
2-heptanone
3-methoxybutyl acetate
Ethylene glycol
Propylene glycol
Buthylene glycol
Ethylene Glycol Monoethyl Ether
Diethylene glycol monoethyl ether
Ethylene glycol monoethyl ether acetate
Ethylene glycol monomethyl ether
Ethylene glycol monomethyl ether acetate
Ethylene glycol mono-n-buthyl ether
Polyethylene glycol
Polypropylene glycol
Polybuthylene glycol
Polyethylene glycol monoethyl ether
Polydiethylene glycol monoethyl ether
Polyethylene glycol monoethyl ether acetate
Polyethylene glycol monomethyl ether
Polyethylene glycol monomethyl ether acetate
Polyethylene glycol mono-n-buthyl ether
Methyl-3-methoxypropionate (MMP)
Propylene glycol monomethyl ether (PGME)
Propylene glycol monomethyl ether acetate (PGMEA)
Propylene glycol monopropyl ether (PGP)
Propylene glycol monoethyl ether (PGEE)
Ethyl-3-ethoxypropionate (FEP)
Dipropylene glycol monoethyl ether Tripropylene glycol monoethyl ether
Polypropylene glycol monoethyl ether
Propylene glycol monomethyl ether propionate
3-methoxymethyl propionate
3-ethoxymethyl propionate
N-methyl-2-pyrrolidone (NMP)

The step of applying gas atmosphere to a substrate through the use of gas produced from organic solvent is carried out, if an organic film pattern is fused when organic solvent percolates thereinto.

For instance, an organic film pattern is soluble in water, acid or alkali, the gas-atmosphere applying step may be carried out through the use of gas produced from aqueous solution, acid solution or alkaline solution.

In the gas-atmosphere applying step, organic solvent is vaporized to gas, and then, a substrate is exposed to the gas. The gas of the organic solvent are provided, for instance, by heating the organic solvent, or by bubbling the organic solvent with inert gas (for instance, nitrogen ($N_2$) gas or argon (Ar) gas).

A unit for heating organic solvent to thereby vaporize the same is comprised of an inner or outer bath containing organic solvent therein. The unit has a function of directly heating the organic solvent or heating the bath to thereby vaporize the organic solvent, and arranging a substrate so as to expose to gas of the organic solvent. For instance, a substrate is arranged at an upper side of the bath with a lower surface thereof facing upward. As an alternative, a substrate is placed on a stage with an upper surface thereof facing upward (namely, an organic film pattern formed on a substrate faces upwardly), and gas of organic solvent is sprayed onto the substrate.

A unit for bubbling organic solvent with inert gas to thereby vaporize the organic solvent, and supplying the vaporized organic solvent together with inert gas includes a tank situated inside or outside of the unit and containing organic solvent therein. The unit has a function of bubbling the organic solvent with inert gas to thereby vaporize the organic solvent, and supplying the vaporized organic solvent together with inert gas, and further, placing a substrate on a stage.

In First Example, gas to be applied to an organic film pattern is supplied by heating organic solvent or bubbling organic solvent with inert gas. Gas to be applied to an organic film pattern may be supplied, for instance, through the use of a gas bomb or a liquidized-gas bomb.

In the second heating step S4, a stage of the heating unit 18 is kept at a predetermined temperature (for instance, a temperature in the range of 80 to 180 degrees centigrade), and a substrate is kept placed on the stage for a predetermined period of time (for instance, 3 to 5 minutes).

The second heating step S4 makes it possible for gas used in the gas-atmosphere applying step to deeply penetrate an organic film pattern, and further, to surely cause the fusion/deformation step to proceed. This means that reflow is additionally caused by heating.

The heating reflow readily occurs, if organic solvent much penetrates the organic film pattern. In comparison with carrying out only heating reflow by heating, it is effective to carry out the gas-atmosphere applying step S3 before carrying out the second heating step S4.

Furthermore, the second heating step S4 puts the organic film pattern into a stable condition before the next step, that is, the third removal step J3 is carried out.

In particular, when the third removal step J3 is comprised of the second chemical-solution step in which a developing agent or chemical solution having a function of developing an organic film pattern is used, the second heating step S4 puts an organic film pattern into such a condition as the organic film pattern is pre-baked before the organic film pattern is developed, ensuring that a developing rate can be controlled.

Namely, when the third removal step is comprised of the second chemical-solution step in which a developing agent or chemical solution having a function of developing an organic film pattern is used, a developing rate lowers as a temperature at which an organic film pattern is heated rises. Thus, it would be possible to control a degree or an amount of an organic film pattern to be partially removed, by controlling a period of time for carrying out the second heating step.

It should be noted that it is necessary to carry out the second heating step at a temperature below a temperature at which resin of which an organic film pattern (in particular, a resist film) is composed is cross-linked, and thus, a developing rate significantly reduces or an organic film pattern cannot be developed.

For an example of a temperature at which the second heating step S4 is carried out, when an organic film pattern is comprised of a positive type photosensitive organic film, and contains novolak resin as a principal constituent, the second heating step S4 is carried out preferably in the range of 50 to 150 degrees centigrade both inclusive, and more preferably in the range of 100 to 130 degrees centigrade both inclusive. By carrying out the second heating step S4 in such a range of a temperature, it would be possible to accomplish a slow developing rate, and to control a removal rate of an organic film pattern, an amount of an organic film pattern to be removed, and a degree of removal of an organic film pattern.

If a temperature at which an organic film pattern is heated after the organic film pattern was formed and before the second heating step S4 is carried out is higher than a temperature at which the second heating step S4 is carried out, the temperature control resulted from the second heating step S4 would be meaningless. Accordingly a temperature at which an organic film pattern is heated before the second heating step S4 is carried out has to be equal or lower than a temperature at which the second heating step S4 is carried out.

In the third removal step J3, a part of an organic film pattern (for instance, a resist pattern) having an area having increased more than necessary in the fusion/deformation reflow, among the organic film pattern having been fused and deformed in the gas-atmosphere applying step S3, is removed.

FIGS. 4A, 4B, 4C and 4D are flowcharts each showing a step or steps to be carried out in examples of the third removal step J3.

Figures 4A, 4B:
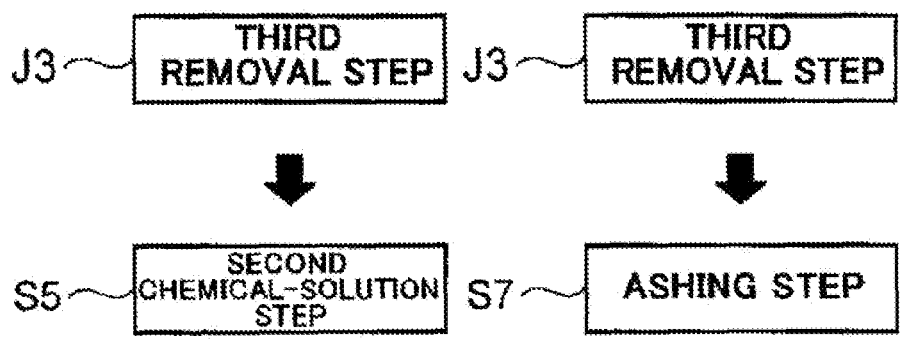
FIG. 4A is a flow chart showing steps to be carried out in a first example of the third removal step.
FIG. 4B is a flow chart showing steps to be carried out in a second example of the third removal step.

As illustrated in FIG. 4A, a first example of the third removal step J3 is comprised of the second chemical-solution step S5 for applying chemical solution to an organic film pattern. There is used chemical solution having a function of developing an organic film pattern or a function of separating an organic film pattern from a substrate.

As illustrated in FIG. 4B, a second example of the third removal step J3 is comprised of the ashing step S7 for ashing an organic film pattern.

Figures 4C, 4D:
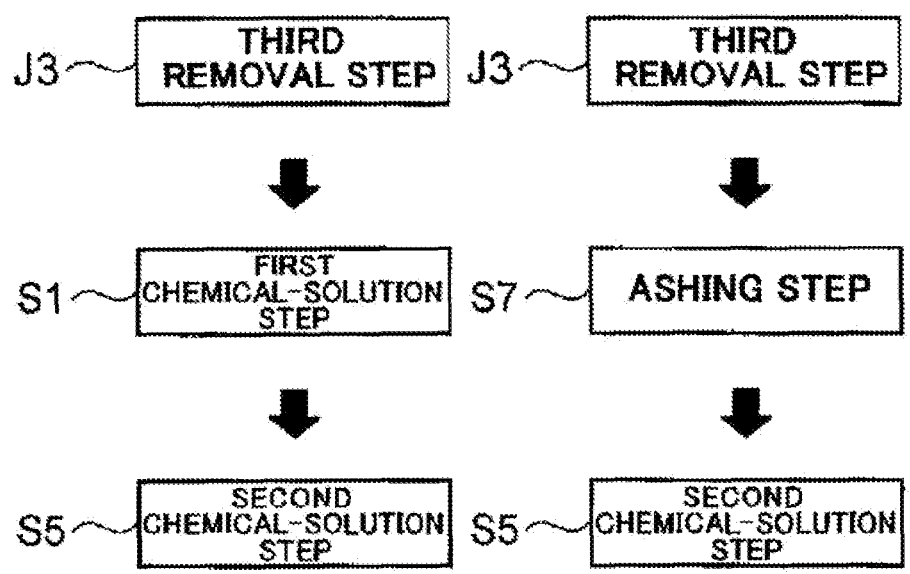
FIG. 4C is a flow chart showing steps to be carried out in a third example of the third removal step.
FIG. 4D is a flow chart showing steps to be carried out in a fourth example of the third removal step.

As illustrated in FIG. 4C, a third example of the third removal step J3 is comprised of, in sequence of, the first chemical-solution step S1 in which chemical solution having a function of removing at least an altered layer or a deposited layer both formed at a surface of an organic film pattern), and the second chemical-solution step S5.

As illustrated in FIG. 4D, a fourth example of the third removal step J3 is comprised of, in sequence of, the ashing step S7, and the second chemical-solution step S5.

In the ashing step, films formed on a substrate are etched with at least one of plasma, ozone and ultraviolet rays.

The removal step J3 may be carried out for the purpose of removing an altered layer or a deposited layer both formed at a surface of the organic film pattern.

The third removal step may include the first or second chemical-solution step. The first or second chemical-solution step may be comprised of any one of the following steps:

(A) a step of developing an organic film pattern through the use of chemical solution having a function of developing the organic film pattern;

(B) a step of developing an organic film pattern through the use of chemical solution having at least a function of developing the organic film pattern;

(C) a N-th step of developing an organic film pattern, wherein N indicates an integer equal to or greater than two;

(D) a chemical-solution step of applying chemical solution not having a function of developing an organic film pattern, but having a fusing an organic film pattern for removal, to the organic film pattern; and (E) a chemical-solution step of applying chemical solution for removal to an altered or deposited layer formed on a surface of an organic film pattern.

As chemical solution to be used in the first and second chemical-solution steps, any one or more of the following chemical solution may be used.

(1) chemical solution obtained by diluting separating agent;

(2) organic or inorganic alkaline aqueous solution;

(3) alkaline aqueous solution containing TMAH (tetramethyl ammonium hydroxide) as a principal constituent;

(4) alkaline aqueous solution containing at least one of NaOH or CaOH;

(5) chemical solution containing at least acid;

(6) chemical solution containing at least organic solvent;

(7) chemical solution containing at least alkaline;

(8) chemical solution containing at least amine as organic solvent;

(9) chemical solution containing at least organic solvent and amine;

(10) alkaline aqueous solution containing at least amine and water;

(11) chemical solution containing at least alkaline and amine;

(12) chemical solution containing, as amine, at least one of monoethyl amine, diethyl amine, triethyl amine, monoisopyl amine, diisopyl amine, triisoply amine, monobutyl amine, dibutyl amine, tributyl amine, hydroxylamine, diethylhydroxylamine, diethylhydroxylamine anhydride, pyridine, and picoline;

(13) chemical solution containing amine in the range of 0.01 to 10 weight % both inclusive;

(14) chemical solution containing amine in the range of 0.05 to 5 weight % both inclusive;

(15) chemical solution containing amine in the range of 0.05 to 2.0 weight % both inclusive; and

(16) chemical solution containing anti-corrosive.

The above-mentioned chemical solution may be used singly or in combination.

A function required in the first chemical-solution step is different from a function required in the second chemical-solution step.

Specifically, the first chemical-solution step is characterized by a step of applying chemical solution for removal to an altered or deposited layer formed on a surface of an organic film pattern, and the second chemical-solution step is characterized by (A) a step of developing an organic film pattern through the use of chemical solution having a function of developing the organic film pattern, (B) a step of developing an organic film pattern through the use of chemical solution having a function of developing at least the organic film pattern, (C) a N-th step of developing an organic film pattern, wherein N indicates an integer equal to or greater than two, or (D) a chemical-solution step of applying chemical solution not having a function of developing an organic film pattern, but having a fusing an organic film pattern for removal, to an organic film pattern.

One of the first and second chemical-solution steps may have function and/or performance of the other.

For instance, the above-mentioned chemical solutions (5) to (16) are principally used in the first chemical-solution step, and the above-mentioned chemical solutions (1) to (4) are principally used in the second chemical-solution step.

However, the above-mentioned chemical solutions (5) to (16) may be used in the second chemical-solution step, and the above-mentioned chemical solutions (1) to (4) may be used in the first chemical-solution step.

In the third heating step S8, a stage of the heating unit 18 is kept at a predetermined temperature (for instance, a temperature in the range of 80 to 180 degrees centigrade), and a substrate is kept placed on the stage for a predetermined period of time (for instance, 3 to 5 minutes). The third heating step S8 recovers an organic film pattern from damages caused to the organic film pattern by the third removal step J3 (chemical-solution step or ashing step), or puts an organic film pattern into a stable condition similarly to the organic film pattern being post-baked after being developed.

In First Example, the apparatus 100 or 200 includes at least the chemical-solution applying unit 21, the substrate-temperature controlling unit 19, the gas-atmosphere applying unit 22, and the heating unit 18 as the processing units U1 to U9 or U1 to U7.

In the apparatus 100, the chemical-solution applying unit 21, the substrate-temperature controlling unit 19, the gas-atmosphere applying unit 22, and the heating unit 18 may be arranged arbitrarily.

The apparatus 100 may be designed to further include the simple light-exposure unit 17, the ashing unit 23, the chemical-solution unit 21, the substrate-temperature controlling unit 19, and the heating unit 18. The apparatus 100 may include a plurality of certain units in accordance with a capacity of each unit.

In contrast, in the apparatus 200, the substrate-temperature controlling unit 19, the gas-atmosphere applying unit 22, the heating unit 18, the substrate-temperature controlling unit 19 (second occurrence), the chemical-solution unit 21, and the heating unit 18 (second occurrence) are necessary to be arranged in this order in a direction indicated with an arrow A in FIG. 6.

The apparatus 200 may be designed to further include the simple light-exposure unit 17, the ashing unit 23, the chemical-solution unit 21, the substrate-temperature controlling unit 19, and the heating unit 18.

In the methods explained hereinafter, it is also necessary to arrange those processing units 19, 22, 18, 19, 21 and 18 in the order in the apparatus 200.

Though FIG. 7 illustrates the back light-exposure unit 24, it is not used in First Example.

In accordance with First Example, by carrying out the third removal step J3, a part of an organic film pattern (for instance, a resist pattern) having an area having increased more than necessary in the fusion/deformation reflow, among the organic film pattern having been fused and deformed in the gas-atmosphere applying step S3, is removed. Thus, it is possible to pattern an organic film pattern into a desired pattern with high accuracy.

The fusion/deformation step carried out as the gas-atmosphere applying step S3 causes an organic film pattern to deform in the range of 5 to 20 micrometers (it is possible to deform an organic film pattern by 100 micrometers or more).

However, since an organic film pattern is much deformed, if the organic film pattern is required to be accurately patterned, it would be necessary to accurately control the deformation of the organic film pattern.

In order to reduce a number of photolithography steps, there may be used an organic film pattern (specifically, a resist pattern) for forming a source and a drain in a channel. The fusion/deformation step is used for deforming two separate portions of the resist pattern located in the vicinity of a channel, corresponding to the source and drain, thereby unifying the separate two portions to each other.

It is necessary to cause much "chemical solution fusion reflow" in order to stably unify the separate two portions to each other. However, if "chemical solution fusion reflow" is carried out so much, a resist pattern associated with portions other than a channel, such as wirings, would be much fused and deformed.

Since an area of an organic film pattern is increased in the fusion/deformation step, it was necessary to accurately control a period of time for carrying out the gas-atmosphere applying step to avoid an organic film pattern from having an area increased more than necessary.

The third removal step J3 contracts or reduces an area of an organic film pattern.

In the third removal step, after an organic film pattern formed on a substrate has been fused and thereby deformed, at least a part of an unnecessary portion of the organic film pattern and a portion of the organic film pattern having an area having increased more than necessary are removed by various processes.

Whereas the related method has only a control to an increasing area of the organic film pattern, for instance, by controlling a period of time for carrying out the fusion/deformation reflow process, the method in accordance with First Example has not only the above-mentioned control, but also a second control for removing a part of the fused/deformed organic film pattern or reducing an area of the fused/deformed organic film pattern. Thus, the method in accordance with First Example makes it possible to accurately control the deformation of the organic film pattern.

In order to reduce a number of photolithography steps in the above-mentioned related art, there was used an organic film pattern (specifically, a resist pattern) for forming a source and a drain in a channel. The fusion/deformation step was used for deforming two separate portions of the resist pattern located in the vicinity of a channel, corresponding to the source and drain, thereby unifying the separate two portions to each other.

However, if the chemical-solution fusion reflow caused by the fusion/deformation step is small, it was not possible to surely unify the separate two portions of an organic film pattern to each other, but there is less generated a portion of an organic film pattern having an area increased more than necessary. If the chemical solution fusion reflow caused by the fusion/deformation step is large, there was much generated a portion of an organic film pattern having an area increased more than necessary, but it is possible to surely unify the separate two portions of an organic film pattern to each other.

In contrast, when the method in accordance with First Example is used for reducing a number of photolithography steps, the chemical-solution reflow is caused sufficiently large due to the third removal step, namely, the fusion/deformation step, and then, a deformed portion of the organic film pattern is removed or contracted, thereby the deformed portion of the organic film pattern would have a desired area. Thus, the method in accordance with First Example provides only the merits obtained in the above-mentioned related art.

The third removal step may be comprised of the second chemical-solution step as a wet process and an ashing step as a dry process singly or in combination.

An ashing step as a dry step can be grouped into two types.

A first type of ashing is a step other than a plasma-discharging step. For instance, a first type of ashing is comprised of a step of applying optical energy of a light having a short wavelength such as ultra-violet ray, or a step of applying ozone to an object such as an organic film.

The first type of ashing exerts less damage on an object, but has a low processing speed. Accordingly, the first type of ashing is used merely for changing a surface condition of an organic film pattern or an underlying film, and is hardly used for a process required to be carried out at a high rate, such as removal of an altered layer formed on an organic film.

In an ashing step other than a plasma-discharging step, ozone gas may be applied to an organic film pattern while being heated, in order to enhance a process rate. However, since an organic film pattern is heat-cured, and hence, much altered so as not to be separated by wet-etching, the step of applying ozone gas to an organic film pattern is scarcely used.

A second type of ashing is a plasma-discharging step. A plasma-discharging step is grouped further into types one and two in dependence on how discharge is generated.

A type one is an isotropic plasma-discharging step to be carried out under a high pressure with low power, and a type two is an anisotropic plasma-discharging step to be carried out under a low pressure with high power.

Both of the type one and two have a process speed higher than that of the first type of ashing, that is, a step other than plasma-discharging steps.

The type two has a higher process speed than the same of the type one.

Thus, since the type one and two have a high process speed, an organic film pattern or an underlying film can be changed with respect to its surface condition in a short period of time. For instance, wettability of an organic film pattern or an underlying film can be enhanced in a short period of time. In addition, the type one and two can be carried out for removal of an altered layer formed on a surface of an organic film pattern, or a high-speed process such as dry peeling-off.

However, the second type of ashing, that is, a plasma-discharging step exerts more damage to an object than the first type of ashing.

In particular, an altered layer formed on an organic film pattern cannot be sufficiently removed by the first type of ashing.

An anisotropic plasma-discharging step (type two) can sufficiently remove an initially formed altered layer, but would exert much damage to an organic film pattern, and resultingly, an altered layer is newly formed on the organic film pattern. Accordingly, it is meaningless to select an anisotropic plasma-discharging step (type two) for removing an altered layer formed on a surface of an organic film pattern.

Thus, an isotropic plasma-discharging step (type one) is usually selected for removing an altered layer formed on a surface of an organic film pattern.

However, in the method suggested in the above-mentioned Japanese Patent Application Publication No. 2002-334830, when an altered layer formed on a surface of an organic film pattern is removed for uniformizing a step of causing chemical (for instance, organic solvent) to percolate into an organic film pattern for deforming the organic film pattern, it would be impossible to completely remove the altered layer even by the anisotropic plasma-discharging step (type two) or the isotropic plasma-discharging step (type one), and it would be also impossible to prevent a small alterated layer from being formed on an organic film pattern due to damage newly exerted by the anisotropic and isotropic plasma-discharging step.

The inventor found out the problem that even such a small alterated layer newly formed due to the plasma-discharging step prevents uniformity of a step of causing chemical solution to percolate into an organic film pattern for deforming the organic film pattern.

That is, the method suggested in the above-mentioned Publication is accompanied with a problem that since uniformity in the fusion/deformation step is insufficient as a result that the organic film pattern is damaged by a plasma-discharging step and that a small alterated film is newly formed on the organic film pattern, a step of etching an underlying film to be carried out subsequently to the fusion/deformation step is insufficiently carried out.

In accordance with First Example, removal of an alterated or deposited layer formed at a surface of an organic film pattern, which was carried out by ashing in the related method, is carried out by a wet step, specifically, a step of applying chemical solution to an organic film pattern. Hence, it is possible to prevent an organic film pattern or a substrate from being damaged.

One of the above-mentioned variants 1 to 4 is selected as the third removal step J3 taking into consideration the above-mentioned matter and the matter mentioned later with reference to FIGS. 12 to 15.

The second heating step S4 of heating an organic film pattern may be omitted, in which case, it is unnecessary for the apparatus 100 or 200 to include the heating unit 18.

If a temperature at which an organic film pattern is heated in the heating unit 18 can be accomplished also in the substrate-temperature controlling unit 19, the second heating step S4 may be carried out in the substrate-temperature controlling unit 19.

In FIGS. 2 to 4, a step sandwiched between parentheses may be omitted, similarly to the heating step S4. Accordingly, a processing unit associated with a step sandwiched between parentheses may be also omitted.

It is preferable that a substrate is cooled down to a room temperature in the second substrate-temperature controlling step S21 after the second heating step S4 has been carried out.

Even if a common step is carried out N times (N is an integer equal to or greater than two), the apparatus 100 is not necessary to include common processing units for carrying out the step, but the apparatus 200 is necessary to include N common processing units for carrying out the step. For instance, if the second heating step S4 has to be carried out twice in the apparatus 200, the apparatus 200 has to include two heating units 18. The same is applied to the methods explained hereinbelow.

Second Example

The method in accordance with Second Example is explained hereinbelow.

The method in accordance with Second Example is carried out for the above-mentioned purposes (A) to (C), similarly to First Example. In other words, the method in accordance with Second Example relates to steps of processing an organic film pattern for the purposes (A) to (C).

FIG. 1B is a flow chart showing steps to be carried out in the method in accordance with Second Example.

As illustrated in FIG. 1B, the method includes, in sequence of, a first removal step J1, a first heating step S9 of heating a substrate and therefore an organic film pattern, a substrate-temperature controlling step S2 of controlling a temperature of the substrate and therefore the organic film pattern, a gas-atmosphere applying step S3 of applying gas atmosphere to the organic film pattern, a second heating step S4 of heating the substrate and therefore the organic film pattern, a second substrate-temperature controlling step S21 of controlling a temperature of the substrate and therefore the organic film pattern, a third removal step J3, and a third heating step S8 of heating the substrate and therefore the organic film pattern.

The first heating step S9, the substrate-temperature controlling step S2, the second heating step S4, the second substrate-temperature controlling step S21, and the third heating step S8 embraced with broken-line brackets in FIG. 1B may be omitted.

Furthermore, the first heating step S9, the substrate-temperature controlling step S2, the second heating step S4, the second substrate-temperature controlling step S21, and the third heating step S8 may be carried out by changing a temperature range in a processing unit prepared for carrying out those steps.

The method in accordance with Second Example can have variants as follows.

(Variant 1)

The method in accordance with the variant 1 includes, in sequence of:

(A) a first removal step J1 of removing at least an alterated layer or a deposited layer formed at a surface of an organic film pattern;

(B) a gas-atmosphere applying step S3 of exposing the organic film pattern to gas atmosphere to thereby fuse and deform an organic film pattern; and (C) a third removal step J3 of removing at least a part of the fused/deformed organic film pattern.

(Variant 2)

The method in accordance with the variant 2 includes, in sequence of (A) a first removal step J1 of removing at least an alterated layer or a deposited layer formed at a surface of an organic film pattern;

(B) a gas-atmosphere applying step S3 of exposing the organic film pattern to gas atmosphere to thereby fuse and deform an organic film pattern;

(C) a second heating step S4 of heating the fused/deformed organic film pattern; and (D) a third removal step J3 of removing at least a part of the fused/deformed organic film pattern.

(Variant 3)

The method in accordance with the variant 3 includes, in sequence of (A) a first removal step J1 of removing at least an alterated layer or a deposited layer formed at a surface of an organic film pattern;

(B) a gas-atmosphere applying step S3 of exposing the organic film pattern to gas atmosphere to thereby fuse and deform an organic film pattern;

(C) a second heating step S4 of heating the fused/deformed organic film pattern;

(D) a third removal step J3 of removing at least a part of the fused/deformed organic film pattern; and (E) a third heating step S8 of heating the fused/deformed organic film pattern.

(Variant 4)

The method in accordance with the variant 4 includes, in sequence of (A) a first removal step J1 of removing at least an altered layer or a deposited layer formed at a surface of an organic film pattern;

(B) a first heating step S9 of heating an organic film pattern;

(C) a gas-atmosphere applying step S3 of exposing the organic film pattern to gas atmosphere to thereby fuse and deform an organic film pattern;

(D) a second heating step S4 of heating the fused/deformed organic film pattern;

(E) a third removal step J3 of removing at least a part of the fused/deformed organic film pattern; and (F) a third heating step S8 of heating the fused/deformed organic film pattern.

The variants 1 to 4 may include a substrate-temperature controlling step S2 of keeping a temperature of a substrate constant. The substrate-temperature controlling step S2 is carried out immediately before the fusion/deformation step S3.

As explained above, the method in accordance with Second Example necessarily includes the first removal step J1, the gas-atmosphere applying step S3, and the third removal step J3, and other steps may be omitted, if necessary.

The first removal step J1 may be comprised of the first chemical-solution step of removing an altered layer or a deposited layer formed at a surface of the organic film pattern through the use of acid solution, alkaline solution, organic solvent and so on, and an ashing step of ashing an organic film pattern, singly or in combination. Specifically, the first removal step J1 is carried out in both of the chemical-solution applying unit 21 and the ashing unit 23.

By carrying out the first removal step J1, it is possible to remove an altered layer or a deposited layer formed at a surface of the organic film pattern, and further, to enhance wettability of a surface of a substrate not covered with the organic film pattern.

In the first removal step J1, an altered layer formed at a surface of an organic film pattern and/or a deposited layer formed at a surface of an organic film pattern are removed in various ways.

FIGS. 2A, 2B and 2C are flow charts each showing a step or steps to be carried out in examples of the first removal step J1.

The first removal step J1 has three examples as follows.

As illustrated in FIG. 2A, a first example of the first removal step J1 is comprised of a first chemical-solution step S1 for applying chemical solution to an organic film pattern to remove an altered layer or a deposited layer formed at a surface of an organic film pattern.

As illustrated in FIG. 2B, a second example of the first removal step J1 is comprised of an ashing step S7 for ashing an organic film pattern.

As illustrated in FIG. 2C, a third example of the first removal step J1 is comprised of, in sequence of, an ashing step S7, and a first chemical-solution step S1.

In the ashing step, films formed on a substrate are etched through the use of at least one of plasma, ozone and ultraviolet rays.

It is preferable in the first chemical-solution step to determine a period of time for carrying out the first chemical-solution step or to select chemical solution in order to selectively remove only an altered layer or a deposited layer formed at a surface of an organic film pattern.

As a result of removal of the altered or deposited layer, it is possible to cause a non-altered portion of an organic film pattern to appear, or to cause a portion of an organic film pattern covered with a deposited layer to appear.

An altered layer to be removed by the first removal step is formed as a result that a surface of an organic film pattern is altered due to degradation caused by aging, thermal oxidation, heat curing, adhesion of a deposited layer thereto, acid etchant (etchant for wet etching), ashing (for instance, $O_2$ ashing), or dry etching gas.

That is, an organic film pattern is physically and chemically damaged and thus altered due to the above-mentioned factors. A degree and character of alteration of an altered layer depends highly on chemical solution to be used in wet-etching, whether plasma process as one of dry-etching is isotropic or anisotropic, whether deposition exists on an organic film pattern, and gas used in dry-etching. Hence, difficulty in removing an altered layer depends also on those factors.

A deposited layer to be removed by the first removal step is formed as a result of dry etching.

A character of a deposited layer depends on whether plasma process as one of dry-etching is isotropic or anisotropic, and gas used in dry-etching. Hence, difficulty in removing a deposited layer depends also on those factors.

Accordingly, it is necessary to determine a period of time for carrying out the first chemical-solution step, and chemical solution to be used in the first chemical solution step in accordance with difficulty in removing an altered layer or a deposited layer.

As chemical solution to be used in the first chemical-solution step, for instance, there is used one of chemical solution containing alkaline chemical, chemical solution containing acid chemical, chemical solution containing organic solvent, chemical solution containing both organic solvent and amine, and chemical solution containing alkaline and amine Alkaline chemical contains, for instance, amine and water, and organic solvent contains, for instance, amine.

Chemical solution containing anticorrosive may be used in the first chemical-solution step.

Amine is selected from monoethyl amine, diethyl amine, triethyl amine, monoisopyl amine, diisopyl amine, triisoply amine, monobutyl amine, dibutyl amine, tributyl amine, hydroxylamine, diethylhydroxylamine, diethylhydroxylamine anhydride, pyridine, or picoline.

Among the above-listed amine, one or more of amine may be contained in chemical solution.

For instance, it is preferable that chemical solution to used in the first chemical-solution step is comprised of aqueous solution containing amine in the range of 0.01 to 10 weight % both inclusive.

The substrate-temperature control step S2 is carried out before the gas-atmosphere applying step S3 in order to keep a temperature of an organic film pattern constant.

For instance, an organic film pattern is kept at a temperature in the range of 10 to 50 degrees centigrade both inclusive by the substrate-temperature control step S2.

In the substrate-temperature control step S2, a substrate is kept placed on a stage of the substrate-temperature controlling unit 19 which is kept at a temperature at which the gas-atmosphere applying step S3 is carried out, until a temperature of the substrate reaches the above-mentioned temperature. For instance, a substrate is kept placed on the stage for 3 to 5 minutes.

The first chemical-solution step S1 and the substrate-temperature control step S2 facilitate gas to penetrate an organic film pattern in the gas-atmosphere applying step S3 to be later carried out, ensuring enhancement of a yield and quality of the gas-atmosphere applying step.

The gas-atmosphere applying step S3, the second heating step S4, the second substrate-temperature control step S21, the third removal step J3 and the third heating step S8 are carried out similarly to First Example.

An apparatus for processing a substrate, to be used in Second Example, is designed to include suitable one or ones among the units 17 to 23 illustrated in FIG. 7 in accordance with an order in which steps in Second Example are carried out and times at which steps in Second Example are carried out.

In comparison with an apparatus processing a substrate, to be used in First Example, the apparatus for processing a substrate, to be used in Second Example, is necessary to additionally include a unit for carrying out the first removal step J1. Accordingly, the apparatus to be used in Second Example additionally includes a processing unit or processing units for carrying out the first removal step J1 relative to the apparatus to be used in First Example. For instance, the apparatus to be used in Second Example additionally includes the chemical-solution applying unit 21 and/or the ashing unit 23. Except a processing unit or processing units for carrying out the first removal step J1, the apparatus to be used in Second Example includes the same processing units as the processing units included in the apparatus to be used in First Example.

Third Example

The method in accordance with Third Example is explained hereinbelow.

The method in accordance with Third Example is carried out for the above-mentioned purposes (A) to (C), similarly to First Example. In other words, the method in accordance with Third Example relates to steps of processing an organic film pattern for the purposes (A) to (C).

FIG. 1C is a flow chart showing steps to be carried out in the method in accordance with Third Example.

As illustrated in FIG. 1C, the method includes, in sequence of, a first removal step J1, a second removal step J2, a first heating step S9 of heating a substrate and therefore an organic film pattern, a substrate-temperature controlling step S2 of controlling a temperature of the substrate and therefore the organic film pattern, a gas-atmosphere applying step S3 of applying gas atmosphere to the organic film pattern, a second heating step S4 of heating the substrate and therefore the organic film pattern, a second substrate-temperature controlling step S21 of controlling a temperature of the substrate and therefore the organic film pattern, a third removal step J3, and a third heating step S8 of heating the substrate and therefore the organic film pattern.

The first heating step S9, the substrate-temperature controlling step S2, the second heating step S4, the second substrate-temperature controlling step S21, and the third heating step S8 embraced with broken-line brackets in FIG. 1C may be omitted.

Furthermore, the first heating step S9, the substrate-temperature controlling step S2, the second heating step S4, the second substrate-temperature controlling step S21, and the third heating step S8 may be carried out by changing a temperature range in a processing unit prepared for carrying out those steps.

The method in accordance with Third Example can have variants as follows.

(Variant 1)

The method in accordance with the variant 1 includes, in sequence of:

(A) a first removal step J1 of removing at least an alterated layer or a deposited layer formed at a surface of an organic film pattern;

(B) a second removal step J2 of removing a part of the organic film pattern;

(C) a gas-atmosphere applying step S3 of exposing the organic film pattern to gas atmosphere to thereby fuse and deform an organic film pattern; and (D) a third removal step J3 of removing at least a part of the fused/deformed organic film pattern.

(Variant 2)

The method in accordance with the variant 2 includes, in sequence of:

(A) a first removal step J1 of removing at least an alterated layer or a deposited layer formed at a surface of an organic film pattern;

(B) a second removal step J2 of removing a part of the organic film pattern;

(C) a gas-atmosphere applying step S3 of exposing the organic film pattern to gas atmosphere to thereby fuse and deform an organic film pattern;

(D) a second heating step S4 of heating the fused/deformed organic film pattern; and (E) a third removal step J3 of removing at least a part of the fused/deformed organic film pattern.

(Variant 3)

The method in accordance with the variant 3 includes, in sequence of:

(A) a first removal step J1 of removing at least an alterated layer or a deposited layer formed at a surface of an organic film pattern;

(B) a second removal step J2 of removing a part of the organic film pattern;

(C) a gas-atmosphere applying step S3 of exposing the organic film pattern to gas atmosphere to thereby fuse and deform an organic film pattern;

(D) a second heating step S4 of heating the fused/deformed organic film pattern;

(E) a third removal step J3 of removing at least a part of the fused/deformed organic film pattern; and (F) a third heating step S8 of heating the fused/deformed organic film pattern.

(Variant 4)

The method in accordance with the variant 4 includes, in sequence of (A) a first removal step J1 of removing at least an alterated layer or a deposited layer formed at a surface of an organic film pattern;

(B) a second removal step J2 of removing a part of the organic film pattern;

(C) a first heating step S9 of heating an organic film pattern;

(D) a gas-atmosphere applying step S3 of exposing the organic film pattern to gas atmosphere to thereby fuse and deform an organic film pattern;

(E) a second heating step S4 of heating the fused/deformed organic film pattern;

(F) a third removal step J3 of removing at least a part of the fused/deformed organic film pattern; and (G) a third heating step S8 of heating the fused/deformed organic film pattern.

The variants 1 to 4 may include a substrate-temperature controlling step S2 of keeping a temperature of a substrate constant. The substrate-temperature controlling step S2 is carried out immediately before the fusion/deformation step S3.

As explained above, the method in accordance with Third Example necessarily includes the first removal step J1, the second removal step J2, the gas-atmosphere applying step S3 and the third removal step J3. Other steps may be omitted, if necessary.

The first removal step J1 to be carried out in Third Example is identical to the first removal step J1 to be carried out in the above-mentioned Second Example.

The second removal step J2 is carried out after the first removal step J1 in which an altered or deposited layer formed at a surface of an organic film pattern is removed has been carried out. In the second removal step J2, a part of the residual organic film pattern is removed. Herein, the residual organic film pattern is a non-altered portion of the organic film pattern.

FIGS. 3A, 3B and 3C are flowcharts each showing a step or steps to be carried out in examples of the second removal step J2.

As illustrated in FIG. 3A, a first example of the second removal step J2 is comprised of a second chemical-solution step S5 for applying chemical solution to an organic film pattern. The chemical solution used in the first example has a function of developing an organic film pattern or a function of separating an organic film pattern.

As illustrated in FIG. 3B, a second example of the second removal step J2 is comprised only of an ashing step S7 for ashing an organic film pattern.

As illustrated in FIG. 3C, a third example of the second removal step J2 is comprised of, in sequence of, an ashing step S7, and a second chemical-solution step S5.

In the above-mentioned ashing step, films formed on a substrate are etched through the use of at least one of plasma, ozone and ultraviolet rays.

In the second removal step J2, an altered or deposited layer formed at a surface of an organic film pattern may be removed.

The second chemical-solution step in the first and third examples is carried out similarly to the second chemical-solution step in the above-mentioned First Example.

The substrate-temperature control step S2 is carried out before the gas-atmosphere applying step S3 in order to keep an organic film pattern at a constant temperature.

For instance, an organic film pattern is kept at a temperature in the range of 10 to 50 degrees centigrade both inclusive by the substrate-temperature control step S2.

In the heating step S2, a stage of the substrate-temperature control unit 19 is kept at a predetermined temperature at which the gas-atmosphere applying step is carried out, and a substrate is placed on the stage for a predetermined period of time (for instance, 3 to 5 minutes).

The gas-atmosphere applying step S3, the second heating step S4, the second substrate-temperature control step S21, the third removal step J3 and the third heating step S8 are carried out similarly to the First Example.

An apparatus for processing a substrate, to be used in the Third Example, is designed to include suitable processing unit or units among the processing units 17 to 23 illustrated in FIG. 7 in accordance with an order in which steps in Third Example are carried out and times at which steps in Third Example are carried out. The apparatus may include a plurality of the same processing units in dependence on a particular step or steps.

In comparison with an apparatus processing a substrate, to be used in First Example, the apparatus for processing a substrate, to be used in Third Example, is necessary to additionally include both a processing unit for carrying out the first removal step J1 and a processing unit for carrying out the second removal step J2. For instance, the apparatus to be used in Third Example includes the chemical-solution applying unit 21 and/or the ashing unit 23. Except a unit for carrying out the first removal step J1 and a unit for carrying out the second removal step J2, the apparatus to be used in Third Example includes the same processing units as the processing units included in the apparatus to be used in First Example.

Hereinbelow is explained a step of exposing an organic film pattern to light, to be carried out in First, Second and Third Examples.

The step of exposing an organic film pattern to light is grouped into a step of exposing an organic film pattern to light through the use of a mask having a minute pattern, and a step of exposing an organic film pattern to light in an area covering therewith a predetermined area (which may be an entire area of a substrate) of a substrate. The latter step is hereinafter referred to as a "simple light-exposure step".

The simple light-exposure step is carried out in the simple light-exposure unit 17. In the simple light-exposure unit 17, an organic film pattern is exposed to ultra-violet ray, fluorescent light, natural light, and other similar lights.

In the simple light-exposure step, an organic film pattern covering a part or all of a substrate therewith is exposed to light. For instance, an organic film pattern covering 1/10 or more of a total area of a substrate therewith is exposed to light.

In the simple light-exposure step, an organic film pattern may be exposed to light at a time in an area corresponding to a predetermined area of a substrate, or an organic film pattern may be scanned with spot light in an area corresponding to a predetermined area of a substrate.

In First, Second and Third Examples, it is preferable that a substrate is kept not exposed to light after initial exposure of a substrate to light for forming an organic film pattern, until development of the organic film pattern is carried out.

By doing so, it would be possible to uniformize effect of development of an organic film pattern, and further uniformize exposure of a substrate to light in the simple light-exposure step.

In order to keep a substrate not exposed to light, all steps may be administrated for this end, or the apparatus 100 or 200 may be designed to have a function of doing so. For instance, the apparatus 100 or 200 is placed entirely in a dark room.

The simple light-exposure step may be carried out in such a manner as mentioned below.

In a first case, an organic film pattern formed on a substrate kept not exposed to light before the simple light-exposure step is carried out is exposed to light in the simple light-exposure step.

In a second case, when a substrate is exposed to light to some degree before the simple light-exposure step is carried out (for instance, when a substrate has been already exposed to ultra-violet rays, fluorescence or natural light, or when a substrate was kept exposed to ultra-violet rays, fluorescence or natural light for a long time), or how degree a substrate is exposed to light is unknown (for instance, a substrate is irregularly exposed to light, or a substrate is exposed to light in no control condition), the simple light-exposure step is carried out for entirely exposing a substrate to light for uniformizing exposure of a substrate to light, or for additionally exposing a substrate to light for precaution.

The ashing step may be comprised of a dry step such as a step of applying plasma to an organic film pattern in oxygen atmosphere or in oxygen/fluorine atmosphere, a step of applying optical energy of light having a short wavelength such as ultra-violet ray, to an organic film pattern, or a step of applying ozone to an organic film pattern through the use of such optical energy and heat.

The above-mentioned altered layer formed on an organic film pattern, to be removed in the ashing step, is caused due to degradation caused by aging, thermal oxidation, heat curing, adhesion of a deposition layer thereto, acid etchant (wet-etching), $O_2$ ashing, and other dry etching gases (dry-etching).

An organic film pattern is physically or chemically damaged and thus deformed due to the above-mentioned factors. A degree and character of alteration of an altered layer depends highly on chemical solution to be used in wet-etching, whether plasma process as one of dry-etching is isotropic or anisotropic, whether deposition exists on an organic film pattern, and gas used in dry-etching. Hence, difficulty in removing an altered layer depends also on those factors.

A deposited layer formed at a surface of an organic film pattern, to be removed by the ashing step, is caused by dry etching.

A character of a deposited layer depends on whether plasma process as one of dry-etching is isotropic or anisotropic, and gas used in dry-etching. Hence, difficulty in removing a deposited layer depends also on those factors.

An ashing step as a dry step can be grouped into two types.

A first type of ashing is a step other than a plasma-discharging step. For instance, a first type of ashing is comprised of a step of applying optical energy of a light having a short wavelength such as ultra-violet ray, or a step of applying ozone to an object such as an organic film.

The first type of ashing exerts less damage on an object, but has a low processing speed. Accordingly, the first type of ashing is used merely for changing a surface condition of an organic film pattern or an underlying film, and is hardly used for a process required to be carried out at a high rate, such as removal of an altered layer formed on an organic film.

In an ashing step other than a plasma-discharging step, ozone gas may be applied to an organic film pattern while being heated, in order to enhance a process rate. However, since an organic film pattern is heat-cured, and hence, much altered so as not to be separated by wet-etching, the step of applying ozone gas to an organic film pattern is scarcely used.

A second type of ashing is a plasma-discharging step. A plasma-discharging step is grouped further into types one and two in dependence on how discharge is generated.

A type one is an isotropic plasma-discharging step to be carried out under a high pressure with low power, and a type two is an anisotropic plasma-discharging step to be carried out under a low pressure with high power.

Both of the type one and two have a process speed higher than that of the first type of ashing, that is, a step other than plasma-discharging steps.

The type two has a higher process speed than the same of the type one.

Thus, since the type one and two have a high process speed, an organic film pattern or an underlying film can be changed with respect to its surface condition in a short period of time. For instance, wettability of an organic film pattern or an underlying film can be enhanced in a short period of time. In addition, the type one and two can be carried out for removal of an altered layer formed on a surface of an organic film pattern, or a high-speed process such as dry peeling-off.

However, the second type of ashing, that is, a plasma-discharging step exerts more damage to an object than the first type of ashing.

In particular, an altered layer formed on an organic film pattern cannot be sufficiently removed by the first type of ashing.

An anisotropic plasma-discharging step (type two) can sufficiently remove an initially formed altered layer, but would exert much damage to an organic film pattern, and resultingly, an altered layer is newly formed on the organic film pattern. Accordingly, it is meaningless to select an anisotropic plasma-discharging step (type two) for removing an altered layer formed on a surface of an organic film pattern.

Thus, an isotropic plasma-discharging step (type one) is usually selected for removing an altered layer formed on a surface of an organic film pattern.

However, in the method suggested in the above-mentioned Japanese Patent Application Publication No. 2002-334830, when an altered layer formed on a surface of an organic film pattern is removed for uniformizing a step of causing chemical (for instance, organic solvent) to percolate into an organic film pattern for deforming the organic film pattern, it would be impossible to completely remove the altered layer even by the anisotropic plasma-discharging step (type two) or the isotropic plasma-discharging step (type one), and it would be also impossible to prevent a small altered layer from being formed on an organic film pattern due to damage newly exerted by the anisotropic and isotropic plasma-discharging step.

The inventor found out the problem that even such a small altered layer newly formed due to the plasma-discharging step prevents uniformity of a step of causing chemical solution to percolate into an organic film pattern for deforming the organic film pattern.

That is, the method suggested in the above-mentioned Publication is accompanied with a problem that since uniformity in the fusion/deformation step is insufficient as a result that the organic film pattern is damaged by a plasma-discharging step and that a small altered film is newly formed on the organic film pattern, a step of etching an underlying film to be carried out subsequently to the fusion/deformation step is insufficiently carried out.

The methods in accordance with First to Third Examples provide a solution to the above-mentioned problems, ensuring that a substrate and therefore an organic film pattern is prevented from being damaged.

Hereinbelow is explained a related method of reducing a number of steps in fabrication of a thin film transistor (TFT) in a liquid crystal display device by means of the fusion/deformation reflow step.

FIGS. 18A to 18G are plan and cross-sectional views of a thin film transistor (TFT) device in each of steps of a related method of fabricating a TFT substrate (not illustrated).

First, as illustrated in FIG. 18A, a gate wire 1001 is formed on a glass substrate.

Then, an interlayer insulating film 1002 is formed so as to cover the gate wire 1001 therewith. For instance, the interlayer insulating film 1002 is comprised of a silicon oxide film ($SiO_2$) and/or a silicon nitride film (SiNx).

Then, a semiconductor film 1003 comprised of an amorphous silicon (a-Si) layer and an ohmic contact (n+a-Si) layer, and a metal film 1004 for a drain are formed on the interlayer insulating film 1002.

The ohmic contact layer is comprised of a n-type amorphous silicon (n+a-Si) layer into which impurity of phosphorus is doped.

Then, an organic film (for instance, a resist film) is formed on the metal film 1004.

Then, the organic film is patterned by exposing the organic film to light through the use of a mask (specifically, a half-tone mask), and developing the organic film. Hereinbelow, the thus patterned organic film is referred to as a resist pattern 1005. The resist pattern 1005 has portions having two different thicknesses.

Then, as illustrated in FIG. 18B, an underlying film situated below the resist pattern 1005, that is, the metal film 1004 is etched with the resist pattern 1005 being used as a mask.

By being etched, the metal film 1004 is turned into source/drain electrodes and source/drain wirings.

Then, as illustrated in FIG. 18C, at least a part of the resist pattern 1005 is removed by the second removal step or a combination of the first and second removal steps.

A thinner portion of the resist pattern 1005 is removed among the two portions of the resist pattern 1005 having two different thicknesses.

The first and second removal steps are carried out similarly to the first and second removal steps carried out in Third Example except that the second removal step is comprised principally of a step developing an organic film pattern through the use of chemical solution having a function of developing the organic film pattern.

Then, as illustrated in FIG. 18D, a fusion/deformation step (fusion/deformation reflow) is carried out to the resist pattern 1005.

The fusion/deformation step is comprised of the gas-atmosphere applying step S3 having been referred to in the First Example.

By carrying out the fusion/deformation step, as illustrated in FIG. 18D, a resist mask for a source electrode and a resist mask for a drain electrode are latitudinally reflowed to join with each other. Thus, there is formed a joint resist mask 1006.

Then, as illustrated in FIG. 18E, the semiconductor film 1003 comprised of the amorphous silicon (a-Si) layer and the ohmic contact (n+a-Si) layer is etched into a semiconductor island 1007 through the use of the joint resist mask 1006, and further through the use of electrodes for source and drain and wirings for source and drain as a mask.

Then, as illustrated in FIG. 18F, the joint resist mask 1006 is separated from the semiconductor island 1007 for removal.

Then, as illustrated in FIG. 18G, a channel etching is carried out such that at least the ohmic contact (n+a-Si) layer is removed between a source and a drain among the amorphous silicon (a-Si) layer and the ohmic contact (n+a-Si) layer, with the electrodes for source and drain and the wirings for source and drain both being as a mask, and the at least a part of the amorphous silicon (a-Si) layer remains as it is.

Hereinafter, a passivation film comprised of an electrically insulating film (generally, a plasma-nitrided silicon film) is formed. Contact holes are formed above the source and drain electrodes. Then, there are formed a pixel electrode which electrically connects to a source electrode at a bottom of the contact hole, and a terminal electrode which electrically connects to a drain electrode at a bottom of the contact hole.

A TFT substrate is fabricated in accordance with the above-mentioned steps. Then, an opposing substrate is arranged in facing relation with the semiconductor island of the TFT substrate. A space formed between the TFT substrate and the opposing substrate is filled with liquid crystal. Thus, there is fabricated a liquid crystal display device.

Fourth Example

Hereinbelow is explained, as Fourth Example, a method of fabricating a TFT substrate used for a liquid crystal display device, including the fusion/deformation reflow step and the step of removing a part of the fused/deformed organic film pattern.

FIGS. 19A to 19G are plan and cross-sectional views of a thin film transistor (TFT) device in a method of fabricating a TFT substrate, in accordance with Fourth Example. In the method, an organic film is exposed to light through a half-tone mask.

First, as illustrated in FIG. 19A, a gate wire 2001 is formed on a glass substrate (not illustrated).

Then, an interlayer insulating film 2002 is formed so as to cover the gate wire 2001 therewith. For instance, the interlayer insulating film 2002 is comprised of a silicon oxide film (SiO.sub.2) and/or a silicon nitride film (SiNx).

Then, a semiconductor film 2003 comprised of an amorphous silicon (a-Si) layer and an ohmic contact (n+a-Si) layer, and a metal film 2004 for a drain are formed on the interlayer insulating film 2002.

The ohmic contact layer is comprised of a n-type amorphous silicon (n+a-Si) layer into which impurity of phosphorus is doped.

Then, an organic film (for instance, a resist film) is formed on the metal film 2004.

Then, the organic film is patterned by exposing the organic film to light through the use of a mask (specifically, a half-tone mask), and developing the organic film. Hereinbelow, the thus patterned organic film is referred to as a resist pattern. The resist pattern 2005 has portions having two different thicknesses.

Then, as illustrated in FIG. 19B, an underlying film situated below the resist pattern 2005, that is, the metal film 2004 is etched with the resist pattern 2005 being used as a mask.

By being etched, the metal film 2004 is turned into source/drain electrodes and source/drain wirings.

Then, as illustrated in FIG. 19C, the fusion/deformation (fusion/deformation reflow) step is carried out to the resist pattern 2005.

The fusion/deformation step is comprised of the gas-atmosphere applying step S3 having been referred to in First Example.

By carrying out the fusion/deformation step, as illustrated in FIG. 19C, a resist mask for a source electrode and a resist mask for a drain electrode are latitudinally reflowed to join with each other. Namely, there is formed a joint resist mask 2006.

If necessary, the first removal step may be carried out prior to the fusion/deformation step, in which case, the first removal step is carried out similarly to the first removal step carried out in Second Example.

The first removal step is carried out for the purpose of removing an altered or deposited layer formed on or around the resist pattern 2005.

Then, as illustrated in FIG. 19D, at least a part of the resist pattern 2005 is removed by the second removal step or a combination of the first and second removal steps.

A thinner portion of the resist pattern 2005 is removed among the two portions of the resist pattern 2005 having two different thicknesses.

The first and second removal steps are carried out similarly to the first and second removal steps carried out in Third Example. The second removal step is comprised principally of a step of developing an organic film through the use of a developing agent.

By carrying out the first and second removal steps, a portion of the resist pattern 2005 having an area having increased due to the fusion/deformation reflow, that is, an unnecessary portion of the resist pattern 2005 is removed, ensuring that the resist pattern 2005 is accurately patterned into a target pattern.

Then, as illustrated in FIG. 19E, the semiconductor film 2003 comprised of the amorphous silicon (a-Si) layer and the ohmic contact (n+a-Si) layer is etched into a semiconductor island 2007 through the use of the joint resist mask 2006 and further through the use of electrodes for source and drain and wirings for source and drain as a mask.

Then, as illustrated in FIG. 19F, the joint resist mask 2006 is separated from the semiconductor island 2007 for removal.

Then, as illustrated in FIG. 19G, a channel etching is carried out such that at least the ohmic contact (n+a-Si) layer is removed between a source and a drain among the amorphous silicon (a-Si) layer and the ohmic contact (n+a-Si) layer, with the electrodes for source and drain and the wirings for source and drain both being as a mask, and the at least a part of the amorphous silicon (a-Si) layer remains as it is.

Hereinafter, a passivation film comprised of an electrically insulating film (generally, a plasma-nitrided silicon film) is formed. Contact holes are formed above the source and drain electrodes. Then, there are formed a pixel electrode which electrically connects to a source electrode at a bottom of the contact hole, and a terminal electrode which electrically connects to a drain electrode at a bottom of the contact hole.

A TFT substrate is fabricated in accordance with the above-mentioned steps. Then, an opposing substrate is arranged in facing relation with the semiconductor island of the TFT substrate. A space formed between the TFT substrate and the opposing substrate is filled with liquid crystal. Thus, there is fabricated a liquid crystal display device.

The channel etching may be carried out after the step of etching the metal film 2004 through the use of the resist pattern 2005 as a mask, illustrated in FIG. 19B, in which case, it is preferable that at least a part of the amorphous silicon (a-Si) layer in a channel area having been contaminated or altered is etched or surface-treated after the joint resist mask 2006 was separated from the semiconductor island 2007 for removal (FIG. 19F). However, it is necessary to remain most of the amorphous silicon (a-Si) layer non-etched or as it is.

Fifth Example

Hereinbelow is explained, as Fifth Example, an example of a method of reducing a number of steps in fabrication of a TFT substrate used for a liquid crystal display device, including the fusion/deformation reflow step and the step of removing a part of the fused/deformed organic film pattern.

FIGS. 20A to 20G are plan and cross-sectional views of a thin film transistor (TFT) device in a method of reducing a number of steps in fabrication of a TFT substrate used for a liquid crystal display device, in accordance with the Fifth Embodiment.

Whereas a half-tone mask was used in Fourth Example, a half-tone mask is not used, but an ordinary mask is used in Fifth Example.

First, as illustrated in FIG. 20A, a gate wire 3001 is formed on a glass substrate (not illustrated).

Then, an interlayer insulating film 3002 is formed so as to cover the gate wire 3001 therewith. For instance, the interlayer insulating film 3002 is comprised of a silicon oxide film (SiO.sub.2) and/or a silicon nitride film (SiNx).

Then, a semiconductor film 3003 comprised of an amorphous silicon (a-Si) layer and an ohmic contact (n+a-Si) layer, and a metal film 3004 for a drain are formed on the interlayer insulating film 3002.

The ohmic contact layer is comprised of a n-type amorphous silicon (n+a-Si) layer into which impurity of phosphorus is doped.

Then, an organic film (for instance, a resist film) is formed on the metal film 3004.

Then, the organic film is patterned by exposing the organic film to light through the use of a mask (specifically, not a half-tone mask, but a standard mask), and developing the organic film. Hereinbelow, the thus patterned organic film is referred to as a resist pattern. The resist pattern 3005 has portions having two different thicknesses.

Then, as illustrated in FIG. 20B, an underlying film situated below the resist pattern 3005, that is, the metal film 3004 is etched with the resist pattern 3005 being used as a mask.

By being etched, the metal film 3004 is turned into source/drain electrodes and source/drain wirings.

Then, as illustrated in FIG. 20C, the fusion/deformation (fusion/deformation reflow) step is carried out to the resist pattern 3005.

The fusion/deformation step is comprised of the gas-atmosphere applying step S3 having been referred to in First Example.

By carrying out the fusion/deformation step, as illustrated in FIG. 20C, a resist mask for a source electrode and a resist mask for a drain electrode are latitudinally reflowed to join with each other. Namely, there is formed a joint resist mask 3006.

If necessary, the first removal step may be carried out prior to the fusion/deformation step, in which case, the first removal step is carried out similarly to the first removal step carried out in Second Example.

The first removal step is carried out for the purpose of removing an altered or deposited layer formed on or around the resist pattern 3005.

Then, as illustrated in FIG. 20D, at least a part of the resist pattern 3005 is removed by the second removal step or a combination of the first and second removal steps.

A thinner portion of the resist pattern 3005 is removed among the two portions of the resist pattern 3005 having two different thicknesses.

The first and second removal steps are carried out similarly to the first and second removal steps carried out in Third Example. The second removal step herein is comprised principally of a step of developing the resist pattern 3005 through the use of a developing agent.

By carrying out the first and second removal steps, a portion of the joint resist mask 3006 having an area having increased due to the fusion/deformation reflow, that is, an unnecessary portion of the joint resist mask 3006 is removed, ensuring that the resist pattern 3005 is accurately patterned into a target pattern.

Then, as illustrated in FIG. 20E, the semiconductor film 3003 comprised of the amorphous silicon (a-Si) layer and the ohmic contact (n+a-Si) layer is etched into a semiconductor island 3007 through the use of the joint resist mask 3006 and further through the use of electrodes for source and drain and wirings for source and drain as a mask.

Then, as illustrated in FIG. 20F, the joint resist mask 3006 is separated from the joint resist mask 3006 for removal.

Then, as illustrated in FIG. 20G, a channel etching is carried out such that at least the ohmic contact (n+a-Si) layer is removed between a source and a drain among the amorphous silicon (a-Si) layer and the ohmic contact (n+a-Si) layer, with the electrodes for source and drain and the wirings for source and drain both being as a mask, and the at least a part of the amorphous silicon (a-Si) layer remains as it is.

Hereinafter, a passivation film comprised of an electrically insulating film (generally, a plasma-nitrided silicon film) is formed. Contact holes are formed above the source and drain electrodes. Then, there are formed a pixel electrode which electrically connects to a source electrode at a bottom of the contact hole, and a terminal electrode which electrically connects to a drain electrode at a bottom of the contact hole.

A TFT substrate is fabricated in accordance with the above-mentioned steps. Then, an opposing substrate is arranged in facing relation with the semiconductor island of the TFT substrate. A space formed between the TFT substrate and the opposing substrate is filled with liquid crystal. Thus, there is fabricated a liquid crystal display device.

The channel etching may be carried out after the step of etching the metal film 3004 through the use of the resist pattern 3005, illustrated in FIG. 20B, in which case, at least a part of the amorphous silicon (a-Si) layer in a channel area having been contaminated or altered is etched or surface-treated even after the joint resist mask 3006 was separated from the semiconductor island 3007 for removal. However, it is necessary to remain most of the amorphous silicon (a-Si) layer non-etched or as it is.

In Fourth and Fifth Examples, the gate electrode, the source electrode, the drain electrode and the metal film of the thin film transistor (TFT) may be comprised of any one of the following layers or structures:

(a) a single layer composed of aluminum or aluminum alloy;

(b) a single layer composed of chromium or chromium alloy;

(c) a two-layered structure including a layer composed of aluminum or aluminum alloy and a layer composed of chromium or chromium alloy;

(d) a two-layered structure including a layer composed of aluminum or aluminum alloy and a layer composed of titanium or titanium alloy;

(e) a two-layered structure including a layer composed of aluminum or aluminum alloy and a layer composed of titanium nitride or titanium nitride alloy;

(f) a two-layered structure including a layer composed of aluminum or aluminum alloy and a layer composed of molybdenum or molybdenum alloy;

(g) a two-layered structure including a layer composed of chromium or chromium alloy and a layer composed of molybdenum or molybdenum alloy;

(h) a three-layered structure including a layer composed of chromium or chromium alloy, a layer composed of molybdenum or molybdenum alloy, and a layer composed of chromium or chromium alloy;

(i) a three-layered structure including a layer composed of molybdenum or molybdenum alloy, a layer composed of aluminum or aluminum alloy, and a layer composed of molybdenum or molybdenum alloy;

(j) a three-layered structure including a layer composed of aluminum or aluminum alloy, a layer composed of molybdenum or molybdenum alloy, and a layer composed of chromium or chromium alloy;

(k) a three-layered structure including a layer composed of aluminum or aluminum alloy, a layer composed of molybdenum or molybdenum alloy, and a layer composed of titanium or titanium alloy; and (l) a three-layered structure including a layer composed of aluminum or aluminum alloy, a layer composed of titanium nitride or titanium nitride alloy, and a layer composed of titanium or titanium alloy.

In the above-mentioned Examples, a TFT substrate is designed to include a glass substrate, but may be designed to include an electrically insulating substrate other than a glass substrate.

The above-mentioned Examples relate to a method of fabricating a pattern of a stagger type TFT. The method may be applied, as well as a method of fabricating a pattern of a stagger type TFT, to a method of fabricating a TFT pattern including a step of forming either a color filter layer or a planarized layer and a color filter layer below a pixel electrode.

The above-mentioned Examples are applied to a vertical electric field drive type liquid crystal display device. It should be noted that the above-mentioned Examples may be applied to a horizontal electric field drive type liquid crystal display device such as an in-plane switching (IPS) type liquid crystal display device.

The methods in accordance with Fourth and Fifth Examples may be included in a method of fabricating a TFT. As an example of a TFT substrate, there is a TFT substrate used for a liquid crystal display device.

A color filter including an electrically insulating film, a color (RGB: red, green and blue) filter layer, a black matrix layer, and a transparent electrode, or a monochromatic filter is fabricated, and then, a pixel electrode composed of ITO, and an alignment film and other parts are formed on the TFT substrate. Then, liquid crystal is sandwiched between the TFT substrate and the opposing substrate in a hermetically sealed condition. Then, a polarizing filter is attached to each of the substrates. Thus, there is completed a liquid crystal display device.

It is possible to control a thickness of a part of a resist mask as follows.

First, there is fabricated a reticle to be used in a step of exposing a resist film to light. The reticle has a mask pattern including a light-impermeable part, and light-permeable parts allowing light to pass therethrough in different degrees. The light-impermeable part and the light-permeable parts are transferred to a resist film to thereby form the above-mentioned resist mask.

As an alternative, two or more reticle masks are used in a step of exposing a resist film to light. An amount of light to which a resist film is exposed is changed in two steps, thereby the above-mentioned resist mask being fabricated.

In the above-mentioned method, a half-tone mask was used to form a resist pattern for controlling a thickness of portions of the resist mask. The half-tone mask is comprised of a reticle having a light-impermeable portion not allowing light to pass therethrough, and a portion allowing half of light to pass therethrough.

Hereinbelow are explained examples of a method of forming a reticle.

Example 1

In Example 1, a light-impermeable portion not allowing light to pass therethrough, and a half-transmission portion allowing half of light to pass therethrough are formed on a reticle substrate.

The portions are composed of chromium, for instance.

The half-transmission portion has a pattern composed of chromium and having a resolution equal to or smaller than maximum exposure resolution. For instance, the half-transmission portion has rectangular patterns arranged at a predetermined pitch, each pattern having a width equal to or smaller than exposure wavelength. As an alternative, the half-transmission portion has such rectangular patterns arranged in a grid.

In Example 1, light transmission of irradiated light for exposure is set in the range of 20 to 80% in the half-transmission portion, that is, in an area in which the above-mentioned chromium pattern having a resolution equal to or smaller than maximum exposure resolution is formed.

Example 2

In Example 2, a light-impermeable portion not allowing light to pass therethrough is formed on a reticle substrate in a predetermined pattern. The light-impermeable portion is composed of chromium. Chromium is etched into a thin film portion.

In an area in which the thin film portion composed of chromium is formed, that is, in a half-transmission portion, light transmission of irradiated light for exposure is set about 50%.

Example 3

In Example 3, a light-impermeable portion not allowing light to pass therethrough is formed on a reticle substrate in a predetermined pattern. The light-impermeable portion is composed of chromium. A half-transmission portion in Example 3 is comprised of a half-tone portion.

The half-tone portion is composed of tungsten silicide or molybdenum silicide, for instance.

Hereinbelow is explained a policy as to selection of the removal step to be carried out for removing an altered or deposited layer formed at a surface of an organic film pattern in each of the above-mentioned First, Second and Third Examples.

Figure 12:
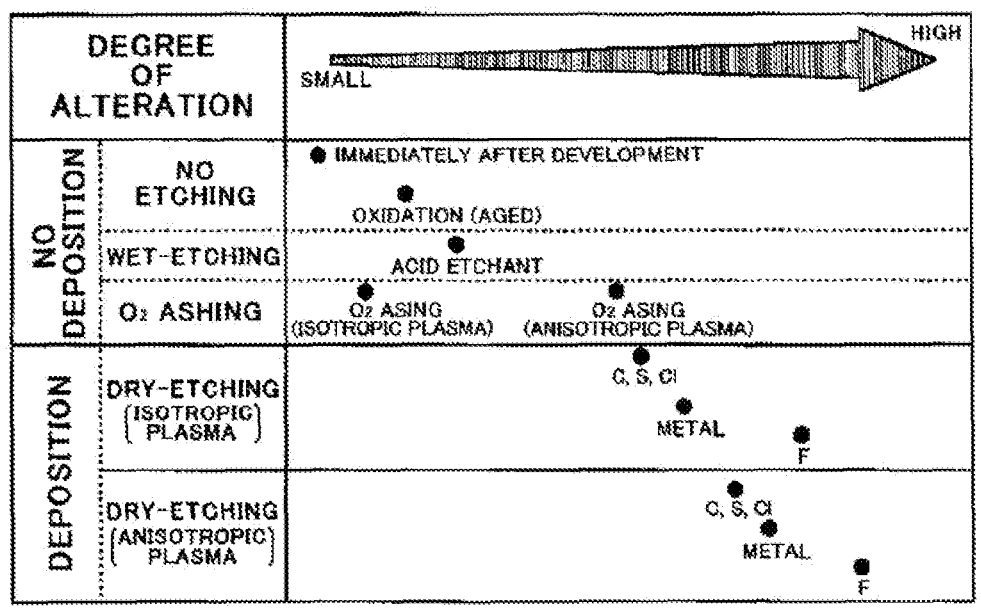
FIG. 12 illustrates a degree of alteration of an altered layer in dependence on causes by which the altered layer is formed.

FIG. 12 illustrates a degree of alteration of an altered layer in dependence on causes by which the altered layer is formed. In FIG. 12, a degree of alteration is determined in accordance with difficulty in peeling off an altered layer with a wet step.

As illustrated in FIG. 12, a degree of alteration of an altered layer depends highly on a chemical to be used in wet-etching, whether dry-etching is isotropic or anisotropic, whether deposition exists on an organic film pattern, and gas used in dry-etching. Hence, difficulty in removing an altered layer depends also on those.

As chemical solution used in the chemical-solution applying step of applying chemical solution to an organic film pattern, there is selected acid solution, alkaline solution or organic solvent alone or in combination.

Specifically, as the chemical solution is selected alkaline aqueous solution or aqueous solution containing at least one amine as organic solvent in the range of 0.01 to 10 weight % both inclusive.

Herein, amine is selected from monoethyl amine, diethyl amine, triethyl amine, monoisopyl amine, diisopyl amine, triisoply amine, monobutyl amine, dibutyl amine, tributyl amine, hydroxylamine, diethylhydroxylamine, diethylhydroxylamine anhydride, pyridine, or picoline.

If a degree of alteration of an altered layer is relatively low, that is, if an altered layer is formed due to oxidation caused by being aged, acid etchant or isotropic oxygen ($O_2$) ashing, the selected chemical solution may contain amine in the range of 0.05 to 5 weight % both inclusive, for instance.

Figure 17:
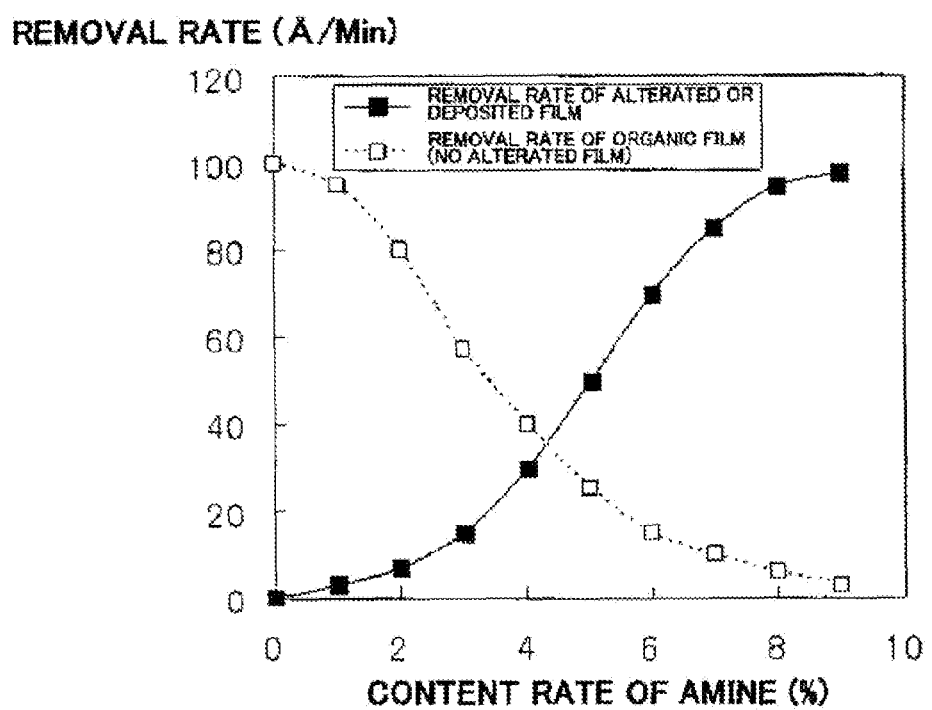
FIG. 17 is a graph showing relation between a concentration of amine in chemical solution and a removal rate, in association with whether an organic film pattern is altered or not.

FIG. 17 is a graph showing relation between a concentration of amine in chemical solution and a removal rate, in association with whether an organic film pattern is altered or not.

As illustrated in FIG. 17, it is preferable that the chemical solution contains amine as organic solvent in the range of 0.05 to 2.0 weight % both inclusive in order to remove only an altered layer and remain a non-altered portion of an organic film pattern.

To this end, it is preferable to select hydroxylamine, diethylhydroxylamine, diethylhydroxylamine anhydride, pyridine, or picoline to be contained in the chemical solution.

It is preferable that the chemical solution contains anticorrosive. As anticorrosive, there may be selected D-glucose ($C_6H_{12}O_6$), chelate or antioxidant.

By setting a suitable period of time for carrying out the step of applying chemical solution to an organic film pattern, as well as selecting suitable chemical solution, it would be possible to remove only an altered or deposited layer, remain a non-altered portion of an organic film pattern, or allow an organic film pattern having been covered with a deposited layer, to appear.

The chemical-solution applying step of applying chemical solution to an organic film pattern provides an advantage that organic solvent is likely to penetrate an organic film pattern in a fusion/deformation step to be carried out subsequently thereto.

Actually, by applying the above-mentioned chemical to an organic film pattern at a surface thereof, an altered layer is cracked, or a part or all of an altered layer is removed. Thus, it would be possible to avoid organic solvent from being prevented by an altered layer from penetrating an organic film pattern in a fusion/deformation step such as the step of applying gas atmosphere to an organic film pattern.

What is important is that a non-altered portion of an organic film pattern should not be removed, but remain, and that organic solvent can readily penetrate a non-altered portion of an organic film pattern by removing only an altered layer or by cracking an altered layer. It is necessary to select chemical solution allowing to do so.

As illustrated in FIGS. 2B, 2C, 3B, 3C, 4B and 4D, it is preferable that the ashing step is carried out prior to the step of applying chemical solution to an organic film pattern, when an altered or deposited layer is firm or thick, or is quite difficult to remove, because the organic film pattern is combined with fluorine.

A combination of the ashing step and the step of applying chemical solution to an organic film pattern solves a problem that it is quite difficult to remove an altered layer only by carrying out the step of applying chemical solution to an organic film pattern, or it takes much time to do the same.

Figure 13:
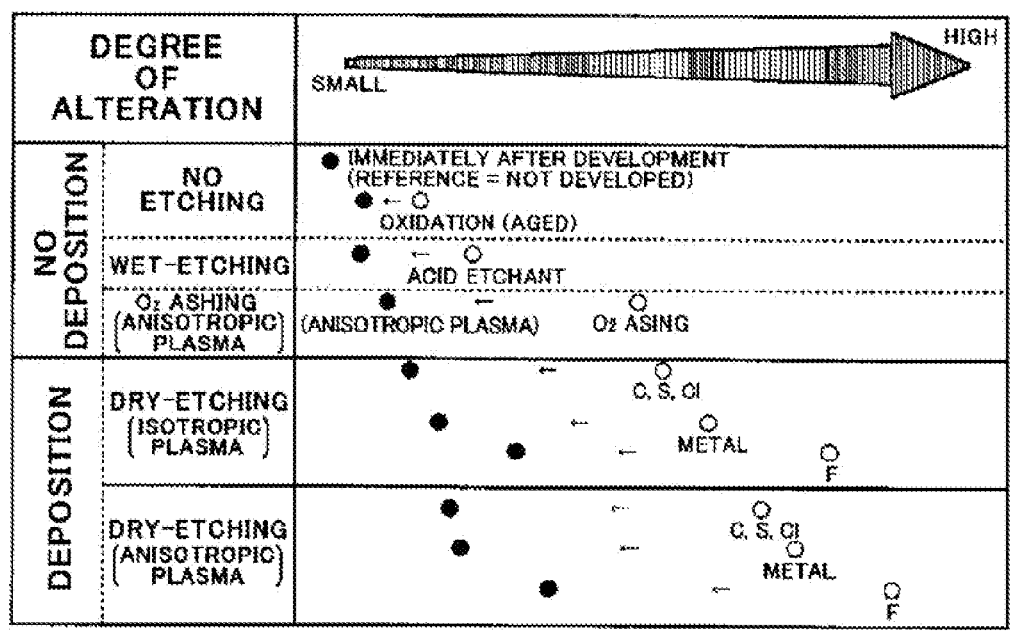
FIG. 13 illustrates variation of an altered layer to which only an oxygen ashing (isotropic plasma) step of applying oxygen ashing is applied.
Figure 14:
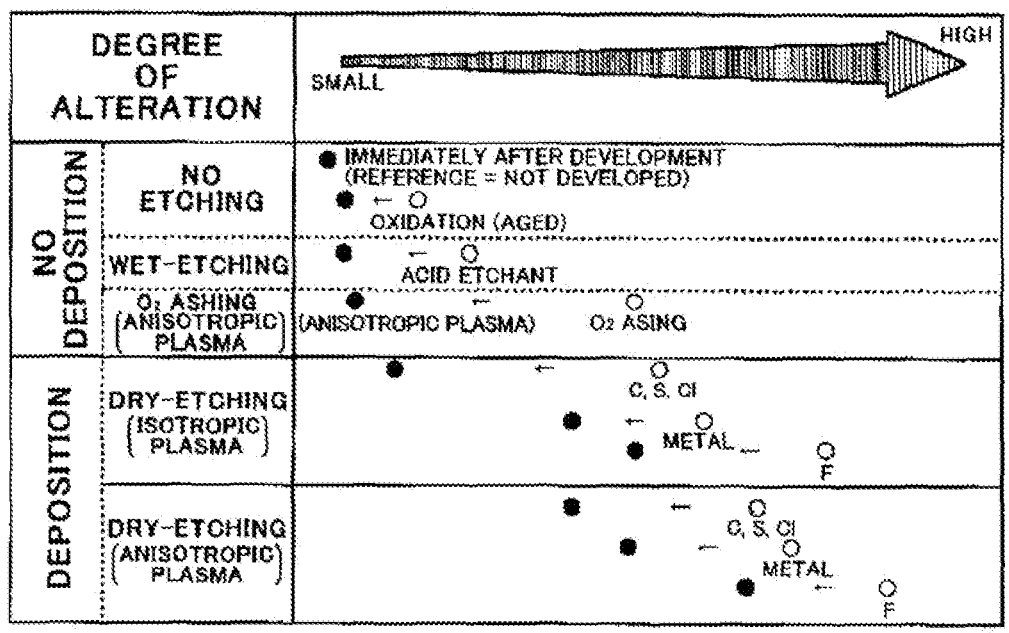
FIG. 14 illustrates variation of an altered layer to which only a chemical-solution applying step of applying chemical solution is applied.
Figure 15:
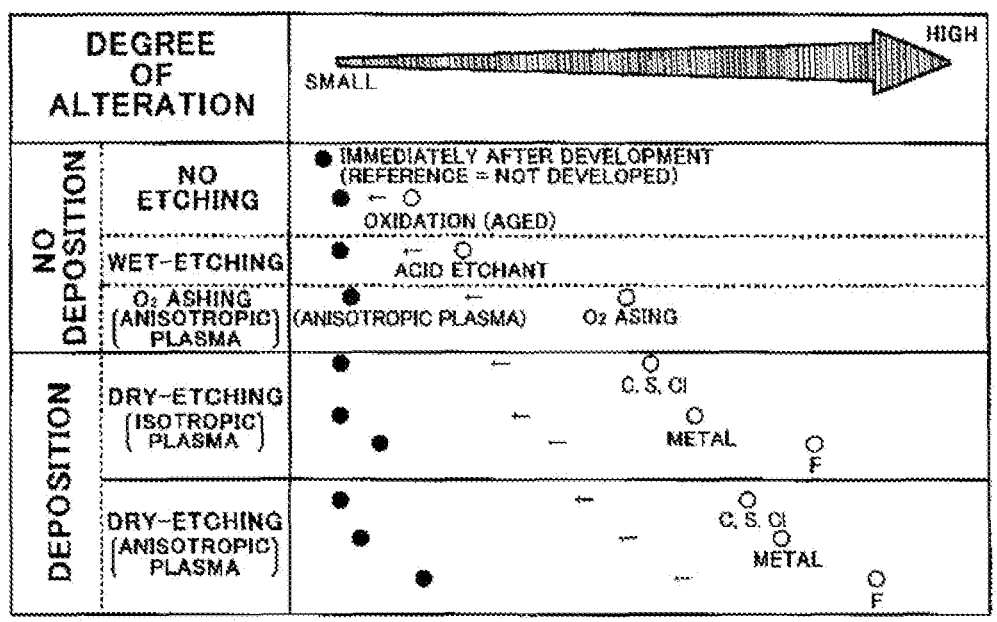
FIG. 15 illustrates variation of an altered layer to which an oxygen ashing step and a chemical-solution applying step of applying chemical solution are applied in this order.

FIG. 13 illustrates variation of an altered layer to which only an oxygen ($O_2$) ashing step or an isotropic plasma step is applied, FIG. 14 illustrates variation of an altered layer to which only a step of applying chemical solution (aqueous solution containing hydroxylamine at 2%) is applied, and FIG. 15 illustrates variation of an altered layer to which both the above-mentioned ashing step and the above-mentioned step of applying chemical solution are applied in this order.

In FIGS. 13 to 15, similarly to FIG. 12, a degree of alteration is determined in accordance with difficulty in peeling off an altered layer with a wet step.

As illustrated in FIGS. 13 to 15, an altered layer can be removed by carrying out any step(s). However, comparing the oxygen ashing step (isotropic plasma step) illustrated in FIG. 13 with the step of applying chemical solution (aqueous solution containing hydroxylamine at 2%) to an alterated layer, illustrated in FIG. 14, a degree of removal of an alterated layer is different from each other in accordance with a thickness and characteristic of an alterated layer.

The oxygen ashing step (isotropic plasma step) is effective to removal of an alterated layer having deposition thereon, as illustrated in FIG. 13, but is likely to damage an object. Hence, if the oxygen ashing step (isotropic plasma step) is carried out to an alterated layer having no deposition thereon, an alterated layer remains without being removed, to a higher degree than a degree at which an alterated layer is removed only by the step of applying chemical solution to an alterated layer (FIG. 14).

In contrast, the step of applying chemical (aqueous solution containing hydroxylamine at 2%) to an alterated layer is less effective than the oxygen ashing step to removal of an alterated layer having deposition thereon, as illustrated in FIG. 14, but does not damage an object. Hence, if the step of applying chemical to an alterated layer is carried out to an alterated layer having no deposition thereon, an alterated layer remains without being removed to a higher degree than a degree at which an alterated layer is removed only by the oxygen ashing (isotropic plasma) step (FIG. 13).

Thus, in order to have the merits shown in FIGS. 13 and 14, the oxygen ashing step (isotropic plasma step) and the step of applying chemical (aqueous solution containing hydroxylamine at 2%) to an alterated layer are carried out in this order, as illustrated in FIG. 15.

It is understood that the method shown in FIG. 15 is effective to both an alterated layer having deposition thereon and an alterated layer having no deposition thereon, and can remove an alterated layer without damage remaining.

It is preferable that a layer lying below an organic film pattern is treated at a surface thereof for enhancing wettability thereof, in order to uniformize a fusion/deformation step such as a step of applying gas atmosphere to an organic film pattern.

For instance, wettability of an underlying film can be enhanced by carrying out the above-mentioned ashing step, that is, the oxygen ($O_2$) plasma step or UV ozone treatment.

For instance, the oxygen plasma step is carried out under the following conditions.

Flow rate of $O_2$: 300 sccm
Pressure: 100 Pa
RF power: 1000 W
Time: 120 seconds The UV ozone treatment is carried out by radiating ultraviolet rays to an underlying film in ozone gas atmosphere with a temperature of a substrate being kept in the range of 100 to 200 degrees centigrade, for instance.

Wettability of an underlying film can be enhanced also by various plasma-discharge steps such as fluorine gas plasma ($SF_6$ gas plasma, $CF_4$ gas plasma, $CHF_3$ gas plasma, etc.) or fluorine/oxygen gas plasma ($SF_6$/$O_2$ gas plasma, $CF_4$/$O_2$ gas plasma, $CHF_3$/$O_2$ gas plasma, etc.).

These plasma steps improve wettability of a surface of an underlying film not covered with an organic film pattern.

Accordingly, by carrying out these plasma steps, an organic film pattern deformed by a fusion/deformation step (for instance, the step of applying gas atmosphere to an organic film pattern) can readily reflow at a surface of an underlying film.

Pre-steps such as various plasma steps, oxygen plasma step or UV ozone step tend to damage an object in comparison with the above-mentioned step of applying chemical solution to an alterated layer. Hence, by removing an alterated layer by applying chemical solution to the alterated layer subsequently to such pre-steps as mentioned above, it would be possible to enhance wettability of an underlying film and remove an alterated layer formed at a surface of an organic film pattern, without damaging an organic film pattern. This ensures uniformly carrying out a fusion/deformation step.

Figure 16:
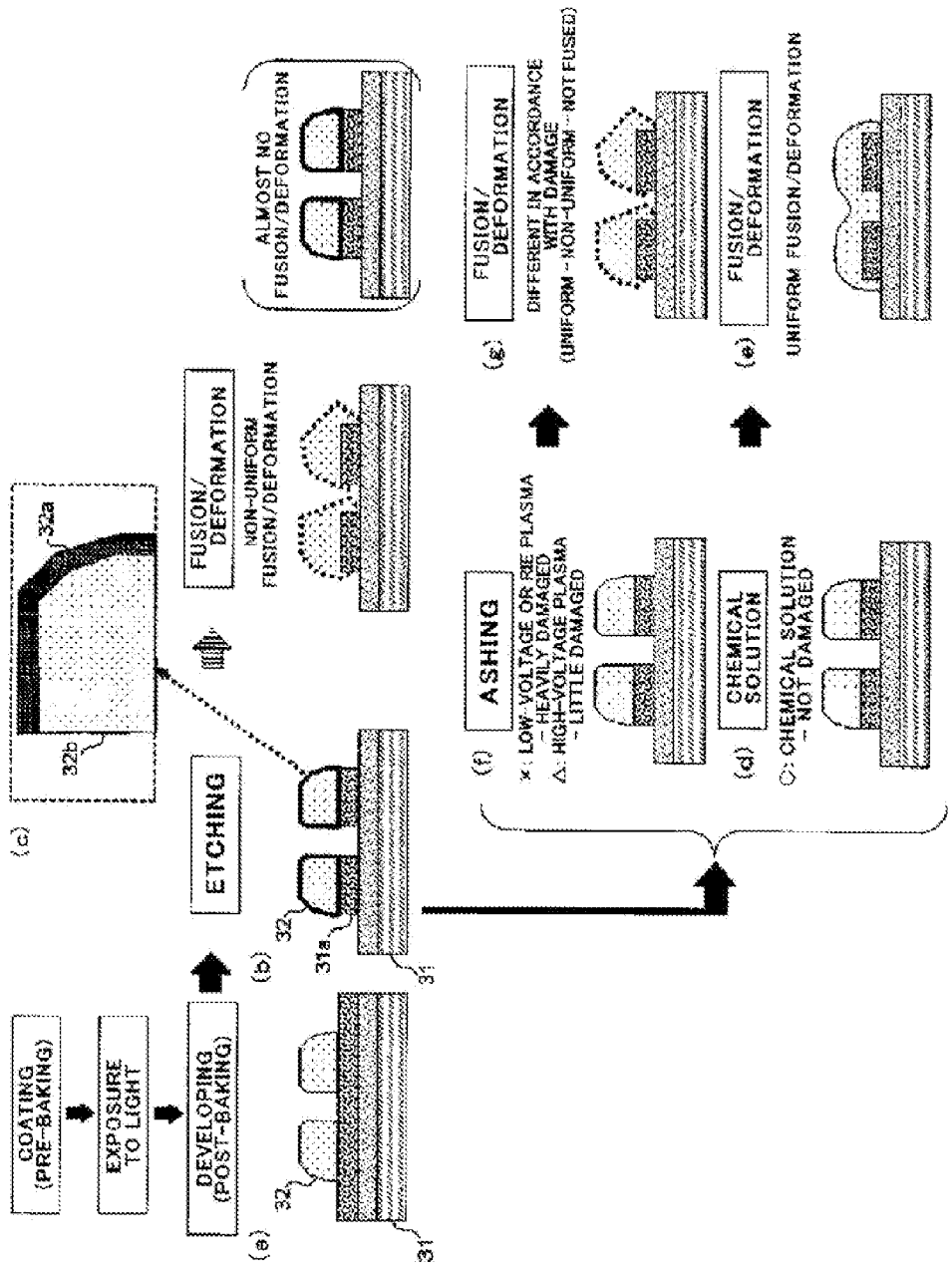
FIG. 16 illustrates a difference with respect to how an organic film pattern is processed in a fusion/deformation step between in the method in accordance with the present invention and in the related method.

FIG. 16 illustrates comparison between the removal steps in the above-mentioned Examples and the related method, both to be carried out prior to a fusion/deformation step (for instance, a gas-atmosphere applying step of applying gas atmosphere to an organic film pattern).

FIG. 16(A) illustrates that an organic film pattern 32 is formed on a substrate 31.

FIG. 16(B) illustrates that an underlying film (for instance, an upper portion 31a of the substrate 31) is patterned by etching with the organic film pattern 32 being used as a mask.

FIG. 16(C) is an enlarged view of the organic film pattern 32 illustrated in FIG. 16(B).

As illustrated in FIG. 16(C), an alterated layer 32a is formed at a surface of the organic film pattern 32, due to the etching. Hence, a non-alterated portion 32b of the organic film pattern 32 is covered with the alterated layer 32a.

FIG. 16(D) illustrates the organic film pattern 32 to which the removal step (for instance, the chemical-solution applying step of applying chemical solution to an organic film pattern) is applied.

As illustrated in FIG. 16(D), as a result of carrying out the removal step, the alterated layer 32a is removed. The organic film pattern 32 is not damaged.

FIG. 16(E) illustrates the organic film pattern 32 to which a fusion/deformation step was applied subsequently to the removal step illustrated in FIG. 16(D).

As illustrated in FIG. 16(E), the organic film pattern 32 is uniformly deformed by the fusion/deformation step.

FIG. 16(F) illustrates the organic film pattern 32 to which the related removal step (only ashing step) is applied.

As illustrated in FIG. 16(F), though the alterated layer 32a is removed even by the related removal step, the organic film pattern 32 remains damaged.

FIG. 16(G) illustrates the organic film pattern 32 to which a fusion/deformation step is applied subsequently to the related removal step illustrated in FIG. 16(F).

As illustrated in FIG. 16(G), the organic film pattern 32 may be uniformly deformed by the fusion/deformation step in accordance with a degree of damage exerted on the organic film pattern 32. However, if the organic film pattern 32 was much damaged, the organic film pattern would be non-uniformly deformed, or the organic film pattern 32 would be fused. Thus, it is difficult to suitably carry out the fusion/deformation step.

The apparatus for processing a substrate is comprised of a substrate carrier for carrying a substrate, a processing unit or processing units selected among the following processing units (a) to (h), and a controller for operating the processing units in accordance with an order in which the steps of the method of processing a substrate are carried out:

(a) a substrate-temperature controlling unit 19 for controlling a temperature of a substrate and hence an organic film pattern;

(b) a gas-atmosphere applying unit 22 for applying gas atmosphere to an organic film pattern;

(c) a heating unit 18 for heating a substrate and hence an organic film pattern;

(d) a chemical-solution applying unit 21 for carrying out the first, second or third chemical-solution applying step;

(e) a developing unit 20 used when the first, second or third chemical-solution applying step is comprised of a developing step;

(f) an ashing unit 23 for ashing an organic film pattern;

(g) a light-exposure unit 17 for exposing an organic film pattern to light; and (h) a back light-exposure unit 19 for exposing an organic film pattern to light through a lower surface of a substrate.

The heating unit 18 and the substrate-temperature controlling unit 19 can control a broad range of a temperature. Hence, if both a range of a temperature controlled by the heating unit 18 and a range of a temperature controlled by the substrate-temperature controlling unit 19 are within a range of a temperature controlled by a certain processing unit, the processing unit can carry out both a substrate-temperature controlling step to be carried out by the substrate-temperature controlling unit 19 and a heating step to be carried out by the heating step 18, by changing a temperature range in accordance with either step to be carried out.

If a method of processing a substrate includes a plurality of common steps, the common steps may be carried out in a single processing unit. As an alternative, in order to enhance a processing yield, the common steps may be carried out in parallel in a plurality of processing units, in which case, a controller memorizing steps of the method controls an order in which steps of the method are carried out.

The methods in accordance with Fourth and Fifth Examples may be applied to, for instance, a liquid crystal display (LCD) device having a flat display panel, an electroluminescence (EL) display device, a field emission display (FED), a fluorescence display device, an active device in a plasma display panel (PDP), or a substrate including an integrated circuit.

In the fourth and fifth embodiments, the present invention is applied to a substrate. It should be noted that the present invention may be applied to a method of fabricating a liquid crystal display device (a vertical electric field type liquid crystal display device, a horizontal electric field type liquid crystal display device, a light-transmission type liquid crystal display device, a light-reflection type liquid crystal display device, and a half-transmission type liquid crystal display device), and a display device such as an EL display device, or a method of fabricating other semiconductor devices.

INDUSTRIAL APPLICABILITY

A method of processing a substrate and chemical solution to be used in the method, in accordance with the above-mentioned Examples, are applied to a substrate. However, it should be noted that the above-mentioned Examples may be applied to a method of fabricating a liquid crystal display device (a vertical electric field type liquid crystal display device, a horizontal electric field type liquid crystal display device, a light-transmission type liquid crystal display device, a light-reflection type liquid crystal display device, and a half-transmission type liquid crystal display device), and a display device such as an electroluminescence (EL) display device, or a method of fabricating other semiconductor devices.

Though the above-mentioned Examples have been explained as a method of processing a substrate such as a semiconductor substrate or a liquid crystal substrate. It should be noted that Examples may be applied to:

(a) a method of and an apparatus for fabricating a device including a substrate processed in accordance with the above-mentioned method or apparatus for processing a substrate;

(b) a method of and an apparatus for fabricating a display device;

(c) a method of and an apparatus for fabricating a semiconductor device;

(d) a method of and an apparatus for fabricating a liquid crystal display device;

(e) a method of and an apparatus for fabricating an electroluminescence (EL) display device;

(f) a method of and an apparatus for fabricating a field emission display device; or (g) a method of and an apparatus for fabricating a plasma display device.

The exemplary advantages obtained by the above-mentioned Examples are described hereinbelow.

A method of processing an organic film pattern formed on a substrate, in accordance with the above-mentioned Examples, includes, in sequence of, a fusion/deformation step of fusing and thereby deforming the organic film pattern, and a third removal step of removing at least a part of the fused and deformed organic film pattern.

The method in accordance with the above-mentioned Examples may include additionally various heating steps and various removal steps (a removal step of removing an alterated or deposited layer formed on a surface of an organic film pattern, or a removal step of removing at least a part of an organic film pattern).

An organic film pattern is enlarged in an area due the fusion/deformation step. The third removal step of removing at least a part of the fused and deformed organic film pattern reduces an area of the thus enlarged organic film pattern. Thus, it is possible to enhance controllability for patterning an organic film pattern into a desired pattern or a desired size.

The fusion/deformation step (specifically, a gas-atmosphere applying step) was carried out also in the relate methods. The fusion/deformation step causes an organic film pattern to deform in the range of 5 to 20 micrometers (it is possible to deform an organic film pattern by 100 micrometers or more).

However, since an organic film pattern is much deformed, if the organic film pattern is required to be accurately patterned, it would be necessary to accurately control the deformation of the organic film pattern.

In order to reduce a number of photolithography steps, there may be used an organic film pattern (specifically, a resist pattern) for forming a source and a drain in a channel. The fusion/deformation step is used for deforming two separate portions of the resist pattern located in the vicinity of a channel, corresponding to the source and drain, thereby unifying the separate two portions to each other.

It is necessary to cause much "chemical solution fusion reflow" in order to stably unify the separate two portions to each other. However, if "chemical solution fusion reflow" is carried out so much, a resist pattern associated with portions other than a channel, such as wirings, would be much fused and deformed.

Accordingly, it was necessary in the related methods to design a resist pattern to have two portions having different thicknesses from each other, and to remove a thinner portion of the resist pattern before carrying out the fusion/deformation step.

However, since an organic film pattern had an increased area due to the fusion/deformation step, it was necessary to accurately control a period of time for carrying out the fusion/deformation step to thereby control accurately the deformation of an organic film pattern, in order to prevent an area of the organic film pattern from increasing.

In contrast, though the method in accordance with the above-mentioned Examples includes the fusion/deformation step (specifically, a gas-atmosphere applying step), the method in accordance with the above-mentioned Examples further includes a step of removing an unnecessary portion of the organic film pattern (for instance, a resist pattern) having an area having been increased more than necessary due to the fusion/deformation reflow.

The step of removing the above-mentioned unnecessary portion of the organic film pattern may be comprised of an ashing step and a chemical-solution step (using chemical solution having a function of developing an organic film pattern or a function of separating an organic film pattern) singly or in combination.

Specifically, in the method in accordance with the above-mentioned Examples, after the fusion/deformation step has been carried out for fusing and thereby deforming an organic film pattern formed on a substrate, an unnecessary portion of the organic film pattern or a portion of the organic film pattern having an area having increased more than necessary is at least partially removed by various removal steps (defined as the "third removal step" in claims).

In the related methods, an area of an organic film pattern is only increased due to the fusion/deformation reflow, and an increasing rate is controlled by controlling a period of time during which the fusion/deformation reflow is carried out, for instance. In contrast, the above-mentioned Examples make it possible to control an area of an organic film pattern in opposite ways. That is, the above-mentioned Examples provide the second control to an area of an organic film pattern by removing or contracting the organic film pattern after the fusion/deformation reflow was carried out, ensuring that the deformation of an organic film pattern can be accurately controlled.

In order to reduce a number of photolithography steps in the related methods, there was used an organic film pattern (specifically, a resist pattern) for forming a source and a drain in a channel. The fusion/deformation step was used for deforming two separate portions of the resist pattern located in the vicinity of a channel, corresponding to the source and drain, thereby unifying the separate two portions to each other.

However, if the chemical solution fusion reflow caused by the fusion/deformation step is small, it was not possible to unify the separate two portions of an organic film pattern to each other, but there is less generated a portion of an organic film pattern having an area increased more than necessary. If the chemical solution fusion reflow caused by the fusion/deformation step is large, there was much generated a portion of an organic film pattern having an area increased more than necessary, but it is possible to unify the separate two portions of an organic film pattern to each other.

In contrast, when the method in accordance with the above-mentioned Examples is used for reducing a number of photolithography steps, the chemical-solution reflow is caused sufficiently large due to the fusion/deformation step, and then, a deformed portion of the organic film pattern is removed or contracted in area, thereby the deformed portion of the organic film pattern would have a desired area. Thus, the method in accordance with the above-mentioned Examples provides only the merits obtained in the related methods.

In the explanation made above, the above-mentioned Examples are applied to a substrate. It should be noted that the above-mentioned Examples may be applied to a method of fabricating a liquid crystal display device (a vertical electric field type liquid crystal display device, a horizontal electric field type liquid crystal display device, a light-transmission type liquid crystal display device, a light-reflection type liquid crystal display device, and a half-transmission type liquid crystal display device), and a display device such as an electroluminescence (EL) display device, or a method of fabricating other semiconductor devices.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2006-147810 filed on May 29, 2006, including specification, claims, drawings and summary is incorporated herein by reference in its entirety.

What is claimed is:

1. A method for processing a substrate, the substrate comprising an organic film pattern, the method comprising:
   a fusion/deformation step of fusing said organic film pattern to deform the fused organic film pattern; and
   a third removal step of removing at least a part of the fused and deformed organic film pattern;
   wherein the substrate further comprises a semiconductor film and a metal film, said metal film is formed on said semiconductor film, said organic film pattern is formed on the metal film, the organic film pattern is a resist pattern, and the method further comprises:
   a first etching step of etching said metal film with said resist pattern being used as a mask;
   said first etching step being carried out before said fusion/deformation step;
   wherein said etched metal film and said fused and deformed organic film pattern form a joint resist mask, the method further comprises:
   a second etching step of etching said semiconductor film with said joint resist mask, said second etching step being carried out after said fusion/deformation step before said third removal step;
   wherein said metal film is turned into a source electrode and a drain electrode of a thin film transistor (TFT) by said first etching step;
   wherein the method further comprising:
   a third etching step of etching said semiconductor film to form a channel of the said TFT, the third etching step being carried out after said third removal step.

2. The method of claim 1, further comprising a first removal step of removing at least one of a deterioration layer and a deposited layer formed on a surface of said organic film pattern, said first removal step being carried out before said fusion/deformation step.

3. The method of claim 2, further comprising a second removal step of removing a part of said organic film pattern, said second removal step being carried out after said first removal step and before said fusion/deformation step.

4. The method of claim 1, wherein said organic film pattern is deformed in said fusion/deformation step by making contact with organic solution to cause fusion reflow.

5. The method of claim 4, wherein said organic solution contains at least one of the following organic solvents (R indicates an alkyl group or a substitutional alkyl group, Ar indicates a phenyl group or an aromatic ring other than a phenyl group): (a) alcohol (R—OH); (b) ether (R—O—R, Ar—O—R, Ar—O—Ar); (3) ester; (4) ketone; and (5) glycol ether.

6. The method of claim 4, wherein said organic film pattern is exposed to vapor of said organic solvent in said fusion reflow.

7. The method of claim 4, wherein said organic film pattern is immersed into said organic solvent in said fusion reflow.

8. The method of claim 4, wherein said fusion reflow is comprised of a step of applying gas atmosphere to said organic film pattern.

9. The method of claim 8, wherein said step of applying gas atmosphere to said organic film patter is carried out in gas atmosphere of said organic solvent.

10. The method of claim 1, further comprising a second heating step of heating the fused and deformed organic film pattern, said second heating step being carried out after said fusion/deformation step and before said third removal step.

11. The method of claim 10, further comprising a third heating step of heating the fused and deformed organic film pattern, said third heating step being carried out after said third removal step.

12. The method of claim 11, further comprising a first heating step of heating said organic film pattern, said first heating step being carried out before said fusion/deformation step.

13. A method of fabricating an apparatus including a substrate processed in accordance with the method defined in claim 1.

14. The method of claim 13, wherein said apparatus is comprised of one of a semiconductor device, a liquid crystal display device, an electro-luminescence (EL) display device, a field emission display device and a plasma display device.

* * * * *